United States Patent
Fukui et al.

(10) Patent No.: US 6,356,194 B1
(45) Date of Patent: Mar. 12, 2002

(54) OCCUPANT DETECTING SYSTEM

(75) Inventors: Tsutomu Fukui; Nobuhiro Koyota; Takashi Inoh; Kazutomo Isonaga, all of Wako (JP)

(73) Assignee: Honda Giken Kogyo Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/227,526

(22) Filed: Jan. 8, 1999

(30) Foreign Application Priority Data

| Jan. 12, 1998 | (JP) | ......... | 10-003937 |
| Jan. 12, 1998 | (JP) | ......... | 10-003938 |
| Jun. 9, 1998 | (JP) | ......... | 10-160139 |
| Jul. 22, 1998 | (JP) | ......... | 10-206643 |

(51) Int. Cl.⁷ ............................................. G08B 13/26
(52) U.S. Cl. ............... 340/561; 340/561; 340/425.5; 340/573.1; 340/573.7; 180/271; 280/728.1; 280/730.1; 280/730.2
(58) Field of Search ............. 340/425.5, 457, 340/573.1, 573.7, 540, 561; 307/10.1; 180/271; 280/728.1, 735, 730.1, 730.2

(56) References Cited

U.S. PATENT DOCUMENTS

| 4,796,013 A | | 1/1989 | Yasuda et al. | ............... 340/540 |
| 4,885,566 A | | 12/1989 | Aoki et al. | ............... 340/457.1 |
| 5,494,311 A | | 2/1996 | Blackburn et al. | ....... 280/730.1 |
| 5,612,876 A | * | 3/1997 | Zeidler et al. | ........... 280/730.1 |
| 5,624,132 A | * | 4/1997 | Blackburn et al. | .......... 280/735 |
| 5,626,359 A | * | 5/1997 | Steffens, Jr. et al. | ........ 280/735 |
| 6,043,743 A | * | 3/2000 | Saito et al. | ................ 280/735 |

FOREIGN PATENT DOCUMENTS

| EP | 0 441 381 A1 | 8/1991 |
| EP | 0 785 101 A2 | 7/1997 |
| EP | 0 855 307 A2 | 7/1998 |
| GB | 2 319 997 | 6/1998 |
| JP | 52-129127 | 10/1977 |
| JP | 6-64491 | 3/1994 |
| WO | 95/21752 | 8/1995 |
| WO | WO 97/28989 | 8/1997 |
| WO | WO 97/29391 | 8/1997 |
| WO | WO 97/30864 | 8/1997 |
| WO | 97/39920 | 10/1997 |

OTHER PUBLICATIONS

JICST_EPLUS database answer No. 4 of 17.*

* cited by examiner

Primary Examiner—Julie Lieu
(74) Attorney, Agent, or Firm—Armstrong, Westerman & Hattori, LLP

(57) ABSTRACT

A high-frequency generating circuit is connected to six electrode fabrics embedded in a seat back of an assistant driver's seat. Output current flowing at the time when a human body approaches the electrode fabrics is detected. It is determined whether an occupant is an adult or a child, by comparing patterns of the output current which correspond to the six electrode fabrics with a first threshold value and a second threshold value to detect the positions of the head, neck and shoulder of the occupant. When the occupant is a child having a short sitting height, the operation of an air bag device is prohibited upon collision of a vehicle, and a warning lamp is lit to move the occupant to a rear seat.

12 Claims, 17 Drawing Sheets

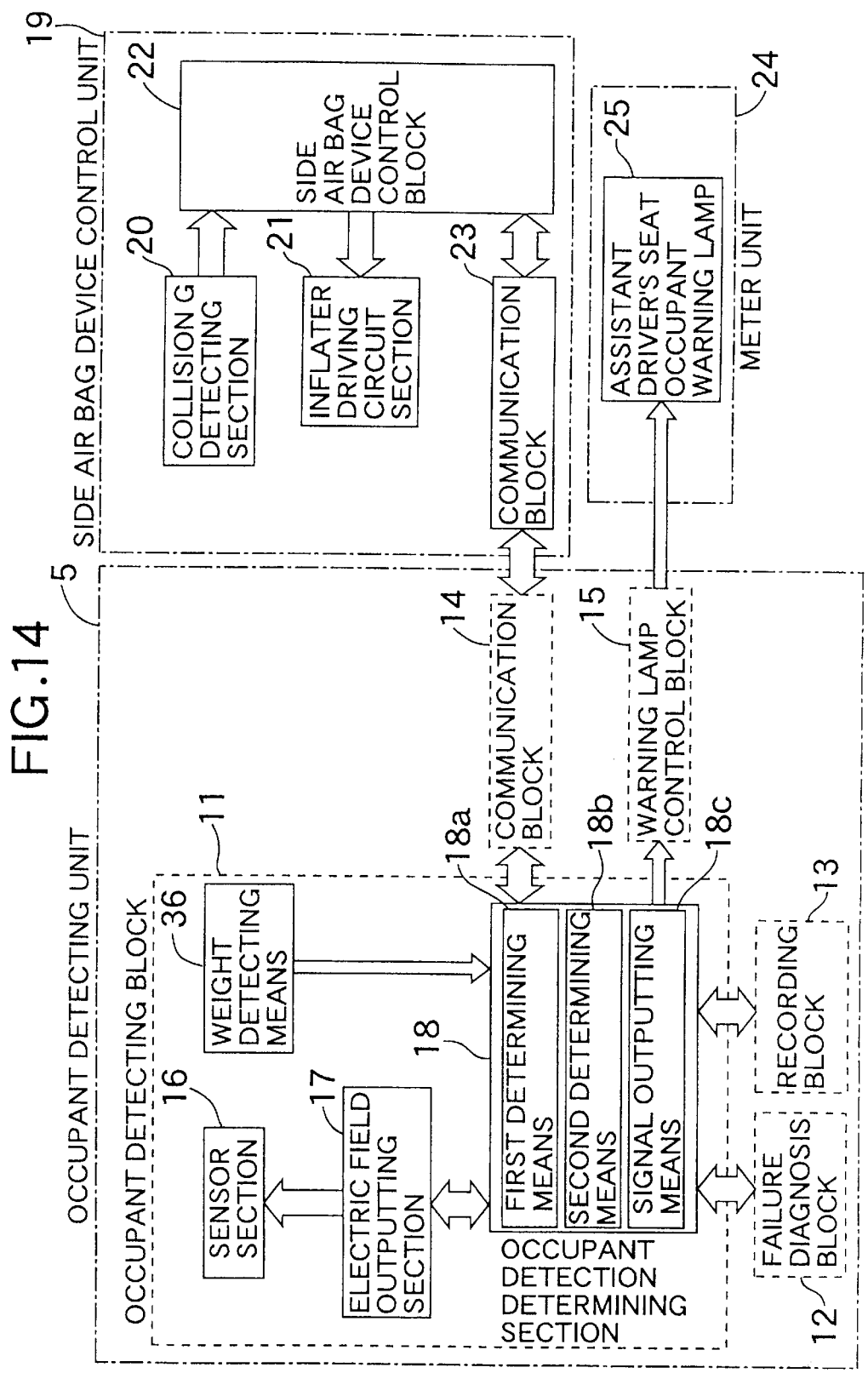

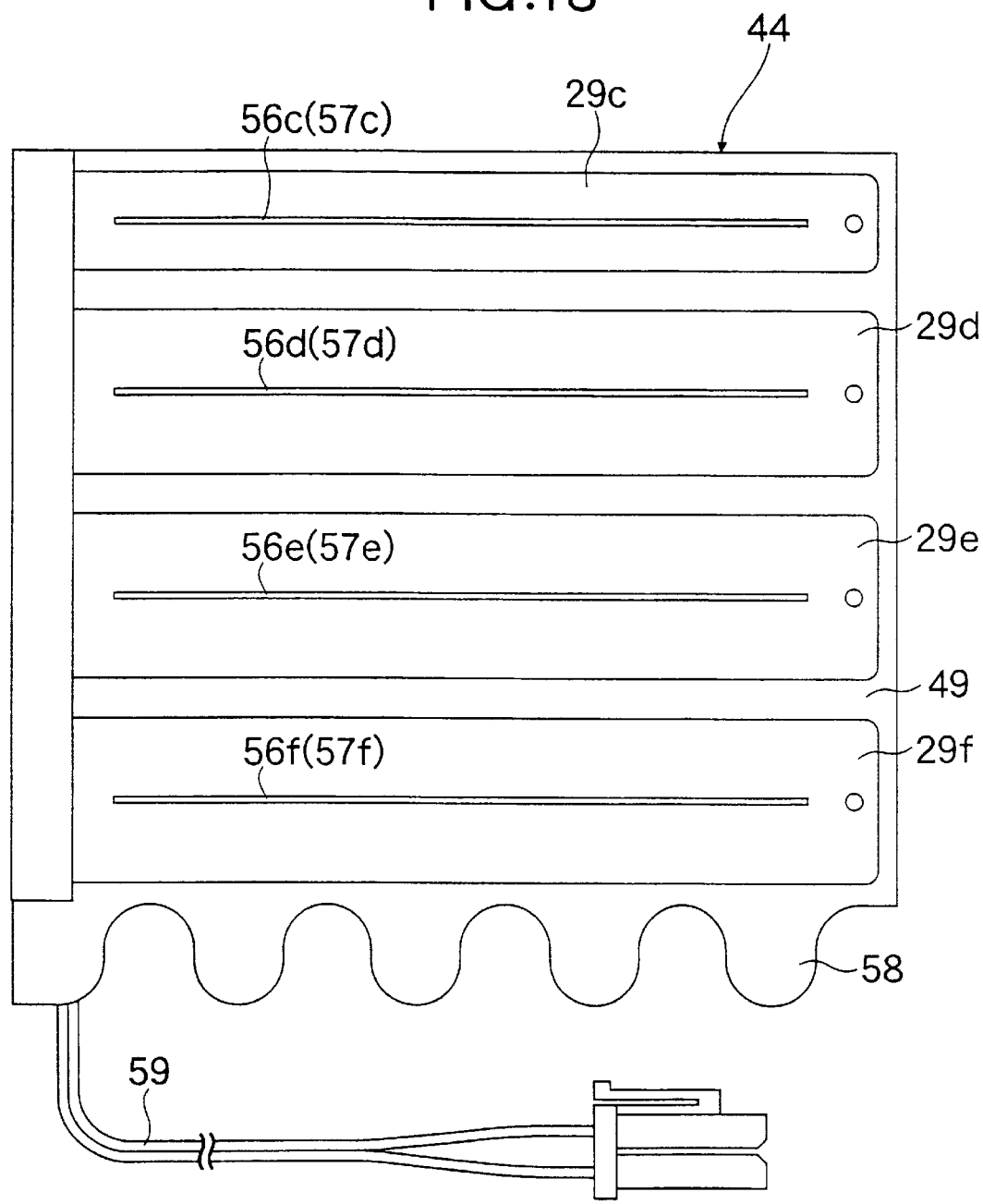

OCCUPANT DETECTING SYSTEM

BACKGROUND OF THE INVENTION

1. Field of the Invention

The present invention relates to an occupant detecting system for-detecting the presence or absence and the physique or attitude of an occupant sitting on a seat of an automobile.

2. Description of the Related Art

An air bag device and a seat belt device for holding back an occupant sitting on a passenger's seat upon a collision of a vehicle are designed on the basis of the physique of an adult. The air bag device and the seat belt device do not necessarily function effectively for a small child in some cases. For this reason, when a child is sitting on the passenger's seat, it is desirable that a warning is given to move the child to a rear seat, or the sudden deployment of an air bag is suppressed. Therefore, an occupant detecting system has been proposed in Japanese Patent Application Laid-open No. 52129127, which is designed to detect the presence or absence and the physique of an occupant sitting on a passenger's seat by providing a plurality of switches which are operated depending on the weight of the occupant sitting on the passenger's seat.

The above conventional occupant detecting system is adapted to detect the presence or absence of the occupant by a switch provided in a seat cushion and to detect the physique of the occupant, i.e., whether an adult or a child, by a switch provided in a seat back and a switch provided in a head rest. However, the above conventional occupant detecting system suffers from a problem that a detection error is liable to be produced due to a variation in hardness of a seat skin member caused by a variation in temperature, a variation in sitting attitude of an occupant, a variation in reclining angle of the seat back and the like, because each of the switches is operated depending on the weight of the occupant.

A side air bag device is conventionally known, for example, from Japanese Patent Application Laid-open No.6-64491, which is adapted to be deployed along an inner surface of a door from a side of a seat back upon a collision of a vehicle to protect a side of an occupant.

The above side air bag device suffers from a problem that when a child sitting on a passenger's seat has fallen asleep to lean toward a door, the head of the child having a short sitting height covers the front of the side air bag device accommodated in a side of a seat back and hence, a side air bag cannot be deployed effectively. Therefore, it can be conceived that the physique and attitude of an occupant sitting on the passenger's seat is detected by an imaging means, such as a camera, and when a child is in a sleeping attitude in which he or she is leaning against the door, the operation of the side air bag device is prohibited.

In this case, however, there is encountered a problem that an expensive camera is required for the detection of the occupant by the imaging means and for this reason, the cost is not only increased, but also the precise detection is difficult because it is governed by the reclining angle of the seat back and the brightness within a vehicle compartment.

It can be also conceived that a sheet-shaped antenna electrode is embedded between a pad of the seat back and a trim cover covering the surface of the pad for detecting the sitting attitude and physique of an occupant sitting on the passenger's seat, and when a child is in a sleeping attitude in which he or she is leaning against the door, the operation of the side air bag device is prohibited. In this case, if the antenna electrode is attached directly to the surface of the pad of the seat back, the antenna electrode can be mounted at a correct position to avoid a reduction in detection accuracy by previously integrally formed irregularities serving as a mark indicating the mounted position of the antenna electrode, when the pad is molded. In fact, however, a sheet-shaped wadding is adhered to the surface of the pad to improve the touch of the seat upon sitting of an occupant, and the antenna electrode is superposed on, and adhered to, the surface of the wadding. Moreover, the wadding is made by cutting a ready-made sheet having a large area into a predetermined size and for this reason, the provision of the irregularities as the mark indicating the mounted position of the antenna electrode is undesirable, because it is a factor for an increase in cost.

When the sheet-shaped antenna electrode is embedded in the seat back, there is a possibility that the cushion property of the seat back may be injured by the antenna electrode, thereby giving an uncomfortable feeling to an occupant sitting on the seat.

SUMMARY OF THE INVENTION

Accordingly, the present invention has been made in view of the above and it is a first object of the present invention to provide an occupant detecting system capable of reliably detecting the presence or absence and the physique of an occupant sitting on a seat of an automobile.

It is a second object of the present invention to ensure that the operation of the side air bag device is reliably prohibited, when an occupant sitting on a seat is in a sleeping attitude in which he or she is leaning against a door.

It is a third object of the present invention to ensure that, when an antenna electrode is fixed to the surface of a pad of the seat through a wadding, the antenna electrode can be positioned easily and reliably without provision of a special mark.

To achieve the above first object, according to a first aspect and feature of the present invention, there is provided an occupant detecting system comprising a plurality of electrode fabrics embedded in a seat back of a seat in an automobile, an electric field generating means for generating an electric field around the electrode fabrics, a human body approach detecting means for detecting the approach of a human body of the electrode fabrics based on electric current flowing from the electric field generating means to each of the electrode fabrics, and a determining means for determining the presence or absence, and the physique, of an occupant sitting on the seat by comparing a combined pattern of those outputs from the human body approach detecting means which correspond to the electrode fabrics with a previously stored pattern.

With the above arrangement, when the occupant sits on the seat, the human body having a high dielectric constant as compared with that of air approaches the plurality of electrode fabrics embedded in the seat back and hence, electric current flowing from the electric field generating means to each of the electrode fabrics is increased. When the electric current flowing to the electric fabrics is increased, the human body approach detecting means detects the approach of the human body to the electric fabrics based on such electric current. The determining means compares the combined pattern of the outputs from the human body approach detecting means with the previously stored patterns, determines whether the occupant is sitting on the seat and determines the physique of the occupant sitting on the seat.

Since the presence and absence and the physique of the occupant sitting on the seat are determined based on the approach of the human body, which is a dielectric to the plurality of electrode fabrics, it is possible to carry out the precise determination irrespective of a variation in hardness of a seat skin member caused by a variation in temperature, a variation in sitting attitude of the occupant, a variation in reclining angle of the seat back, and the like.

To achieve the second object, according to a second aspect and feature of the present invention, there is provided an occupant detecting system comprising an electric fabric embedded in a side of a seat back of a seat in an automobile, an electric field generating means for generating an electric field around the electrode fabric, a human body approach detecting means for detecting the approach of a human body to the electrode fabric based on electric current flowing from the electric field generating means to the electrode fabric, and a determining means for determining whether the body of an occupant sitting on the seat is leaning sideways, based on an output from the human body approach detecting means.

With the above arrangement, when the body of an occupant sitting on the seat leans sideways, the body of the occupant having a high dielectric constant as compared with that of air approaches the electrode fabric embedded in the side of the seat back and hence, the electric current flowing from the electric field generating means to the electrode fabric is increased. As a result, the human body approach detecting means detects the approach of the occupant body to the electrode fabric based on the electric current, and the determining means determines whether the body of the occupant is leaning sideways, based on the result of such detection.

To achieve the second object, according to a third aspect and feature of the present invention, there is provided an occupant detecting system comprising a plurality of first electrode fabrics embedded in a central portion of a seat back of a seat in an automobile, at least one second electrode fabric embedded in a side of the seat back of the seat, an electric field generating means for generating an electric field around the first and second electrode fabrics, a human body approach detecting means for detecting the approach of a human body to the first and second electrode fabrics, based on electric current flowing from the electric field generating means to the first and second electrode fabrics, a first determining means for determining whether a sitting height of an occupant sitting on the seat is equal to, or smaller than, a reference value by comparing a combined pattern of outputs from the human body approach detecting means which correspond to the first electrode fabrics with a previously stored pattern, a second determining means for determining whether the body of an occupant sitting on the seat is leaning sideways, based on an output from the human body approach detecting means which corresponds to the second electrode fabric, and a signal outputting means for outputting a signal indicative of a command to prohibit the deployment of a side air bag device provided in the side of the seat back, when the first determining means determines that the sitting height of the occupant sitting on the seat is equal to, or smaller than, the reference value, and the second determining means determines that the body of the occupant is leaning sideways.

With the above arrangement, when the occupant sits on the seat, the body of the occupant having a high dielectric constant as compared with that of air approaches the first and second electrode fabrics embedded in the seat back and hence, the electric current flowing from the electric field generating means to the electric fabrics is increased. When the electric current flowing to the electrode fabrics is increased, the human body approach detecting means detects the approach of the human body to the electrode fabrics, based on such electric current.

The first determining means compares the combined pattern of those outputs from the human body approach detecting means which correspond to the plurality of first electrode fabrics with the previously stored pattern, and determines whether the sitting height of the occupant sitting on the seat is equal to, or smaller than, the reference value. The second determining means determines whether the body of the occupant sitting on the seat is leaning sideways, based on those outputs from the human body approach detecting means which correspond to the plurality of second electrode fabrics. The signal outputting means outputs the signal indicative of the command to prohibit the deployment of the air bag device by determining that a small occupant is sitting on the seat in a sleeping attitude, when the sitting height of the occupant is equal to, or smaller than, the reference value and the body of the occupant is leaning sideways.

To achieve the second object, according to a fourth aspect and feature of the present invention, there is provided an occupant detecting system comprising a weight detecting means embedded in a seat cushion of a seat in an automobile, at least one electrode fabric embedded in a side of a seat back of the seat, an electric field generating means for generating an electric field around the electrode fabric, a human body approach detecting means for detecting the approach of a human body to the electrode fabric, based on electric current flowing from the electric field generating means to the electrode fabric, a first determining means for determining whether the weight of an occupant sitting on the seat is equal to, or smaller than, a reference value, based on an output from the weight detecting means, a second determining means for determining whether the body of the occupant sitting on the seat is leaning sideways, based on an output from the human body approach detecting means, and a signal outputting means for outputting a signal indicative of a command to prohibit the deployment of a side air bag device provided in the side of the seat back, when the first determining means determines that the weight of the occupant sitting on the seat is equal to or smaller than the reference value and the second determining means determines that the body of the occupant is leaning sideways.

With the above arrangement, when the occupant sits on the seat, the weight detecting means embedded in the seat cushion detects the weight of the occupant, and the first determining means determines whether the detected weight is equal to, or smaller than, the predetermined value. When the occupant sits on the seat, the electric current flowing from the electric field generating means to the electrode fabric is increased, because the human body having a high dielectric constant as compared with that of air approaches the electrode fabric embedded in the side of the seat back. When the electric current flowing to the electrode fabric is increased, the human body approach detecting means detects the approach of the human body to the electrode fabric, based on the electric current. The second determining means determines whether the body of the occupant on the seat is leaning sideways, based on the output from the human body approach detecting means.

When the first determining means determines that the weight of the occupant is equal to, or smaller than, the reference value and the second determining means determines that the body of the occupant on the seat is leaning sideways, based on the output from the human body approach detecting means, the signal outputting means outputs the signal indicative of the command to prohibit the deployment of the side air bag device on the basis of the determination of a small occupant sitting in a sleeping attitude.

The physique of the occupant is determined based on the weight of the occupant, and the leaning of the body of the occupant is determined based on the approach of the human body which is a dielectric. Therefore, it is possible to reliably detect a state in which a small occupant having a short sitting height is sitting on the seat in a sleeping attitude, thereby prohibiting the deployment of the side air bag device.

To achieve the third object, according to a fifth aspect and feature of the present invention, there is provided an occupant detecting system comprising a sheet-shaped antenna electrode fixed to a surface of a pad of a seat back through a wadding to detect the sitting attitude and physique of an occupant, wherein the antenna electrode is positioned on the pad by conforming at least a portion of the profile of the antenna electrode to the profile of the pad.

With the above arrangement, when the sheet-shaped antenna electrode is fixed to the surface of the pad of seat back through the wadding, the antenna electrode can be positioned easily and precisely without provision of a special mark by conforming at least a portion of the profile of the antenna electrode to the profile of the pad, thereby enhancing the accuracy of detection of the sitting attitude and physique of the occupant.

To achieve the fourth object, according to a sixth aspect and feature of the present invention, there is provided an occupant detecting system comprising a sheet-shaped antenna electrode formed of an electrode fabric laminated on a base fabric, the antenna electrode being fixed to a surface of a seat back, wherein the electrode fabric has an opening made therein.

With the above arrangement, the flexibility of the antenna electrode is increased by virtue of the opening made on the electrode fabric and hence, the conformation of the antenna electrode to the seat is improved, leading to an enhanced sitting feeling of an occupant.

The above and other objects, features and advantages of the invention will become apparent from the following description of the preferred embodiment taken in conjunction with the accompanying drawings.

BRIEF DESCRIPTION OF THE DRAWINGS

FIGS. 1 to 6 show a first embodiment of the present invention, wherein

FIG. 1 is a partial side view of an automobile provided with an air bag device;

FIG. 2 is a block diagram of a control system;

FIG. 3 is a perspective view of an assistant driver's seat;

FIG. 4 is a circuit diagram of an electric field generating section;

FIG. 5 is a graph showing the relationship between the distance of a human body and the sensor output;

FIG. 6 is a diagram for explaining a technique for detecting the physique of an occupant;

FIGS. 7 to 11 show a second embodiment of the present invention; wherein

FIG. 7 is a plan view of an assistant driver's seat provided with a side air bag device;

FIG. 8 is an exploded perspective view of the assistant driver's seat;

FIG. 9 is a perspective view of the assistant driver's seat;

FIG. 10 is a view taken in a direction of an arrow 10 in FIG. 9;

FIG. 11 is a block diagram of a control system;

FIGS. 14 and 15 show a third embodiment of the present invention, wherein

FIG. 14 is a block diagram of a control system;

FIG. 15 is a perspective view of an assistant driver's seat:

FIG. 18 is an illustration showing another modification to the fourth embodiment of the present invention.

DETAILED DESCRIPTION OF THE PREFERRED EMBODIMENTS

A first embodiment of the present invention will now be described with reference to FIGS. 1 to 6.

Figure 1:
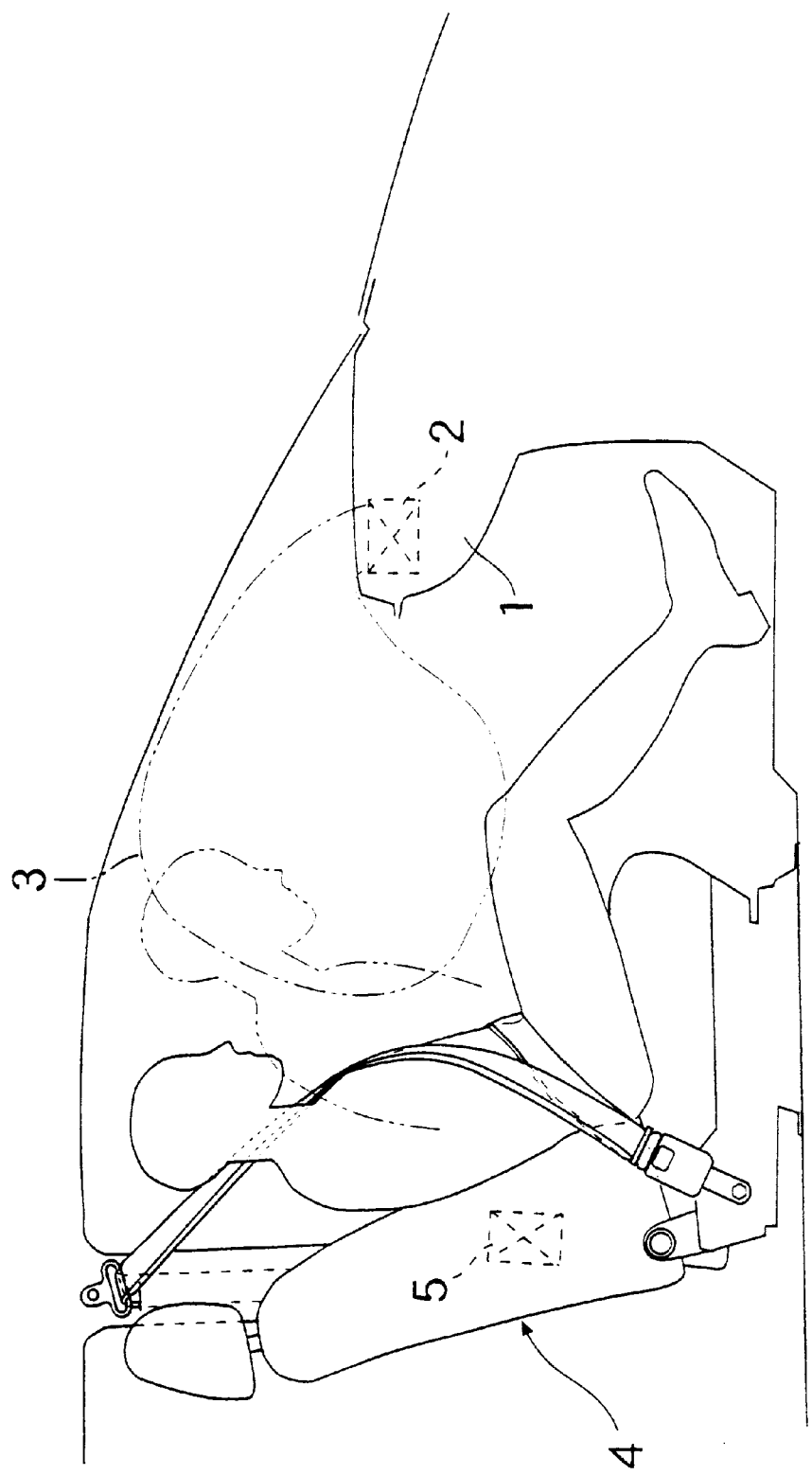

Referring to FIG. 1, upon a collision of a vehicle, an air bag 3 is deployed into a vehicle compartment from an air bag device 2 which is mounted within a dash board 1, thereby holding back an occupant sitting on a passenger's seat 4. The air bag device 2 is designed so that it is operated when the occupant sitting on the passenger's seat 4 is an adult, but it is not operated when the occupant is a child of a small physique (e.g., younger than 6 years old). For this purpose, an occupant detecting unit 5 for detecting whether the occupant is an adult or child is mounted in the passenger's seat 4.

Figure 2:
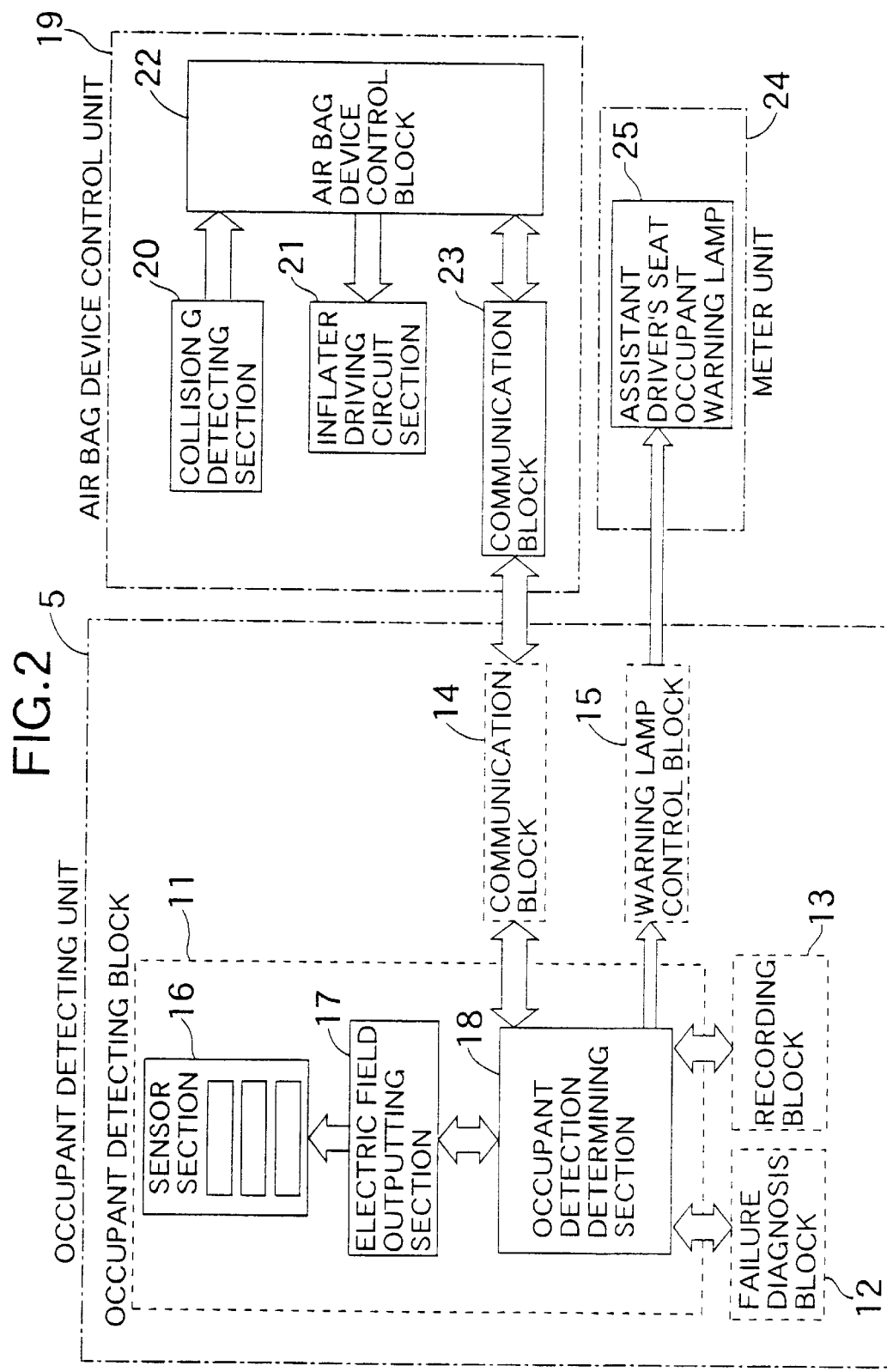

As shown in FIG. 2, the occupant detecting unit 5 comprises an occupant detecting block 11, a failure diagnosis block 12, a recording block 13, a communication block 14 and a warning lamp control block 15. The occupant detecting block 11 is comprised of a sensor section 16, an electric field output section 17 and an occupant detection determining section 18. Connected to the occupant detection determining section 18 are the failure diagnosis block 12 for detecting an abnormal state, such as a failure, and the recording block 13 for storing various threshold values which are criteria for carrying out the detection of an occupant.

An air bag device control unit 19 is connected to the communication block 14 of the occupant detecting unit 5 and is comprised of a collision acceleration detecting section 20, an inflater driving circuit section 21, an air bag device control block 22, and a communication block 23. When the collision acceleration detecting section 20 detects an acceleration generated by the collision of the vehicle, the inflater driving circuit section 21 ignites an inflater by a command from the air bag device control block 22 to operate the air bag device 2. At this time, when the occupant detection determining section 18 determines that a child is sitting on the passenger's seat 4, an air bag deployment prohibiting command signal is outputted to the air bag device control block 22 via the communication blocks 14 and 23, whereby the air bag device control block 22 prohibits the operation of the air bag device 2 by the inflater driving circuit section 21. As a result, only when a child is sitting on the passenger's seat 4, the operation of the air bag device 2 is prohibited.

The warning lamp control block 15 of the occupant detecting unit 5 is connected to an assistant driver's seat occupant warning lamp 25 of a meter unit 24 provided in an instrument panel. When the occupant detection determining section 18 determines that a child is sitting on the assistant driver's seat 4, a warning command signal is outputted to light the assistant driver's seat occupant warning lamp 25, thereby giving a warning to move the child to a rear seat.

Figure 3:
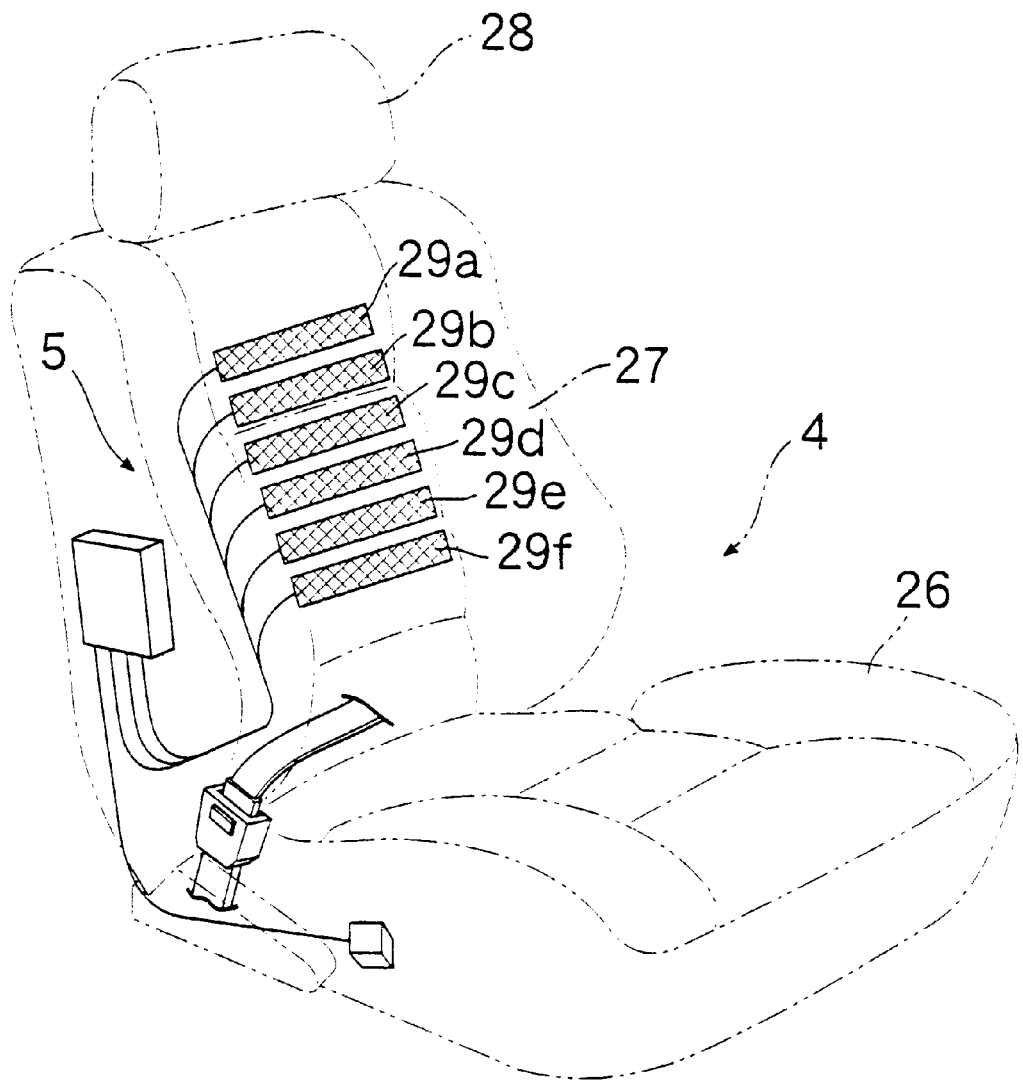

As shown in FIG. 3, the passenger's seat 4 is comprised of a seat cushion 26, a seat back 27 and a head rest 28, and six electrode fabrics 29a, 29b, 29c, 29d, 29e, and 29f as antenna electrodes constituting the sensor section 16 are embedded inside a skin member covering a front surface of the seat back 27 against which a back of an occupant sitting on the passenger's seat 4 abuts. The electrode fabrics 29a, 29b, 29c, 29d, 29e and 29f, made of an electrically conductive fabric piece, are each formed into a laterally elongated band shape and are disposed in a lined-up arrangement of six vertical stages.

Figure 4:
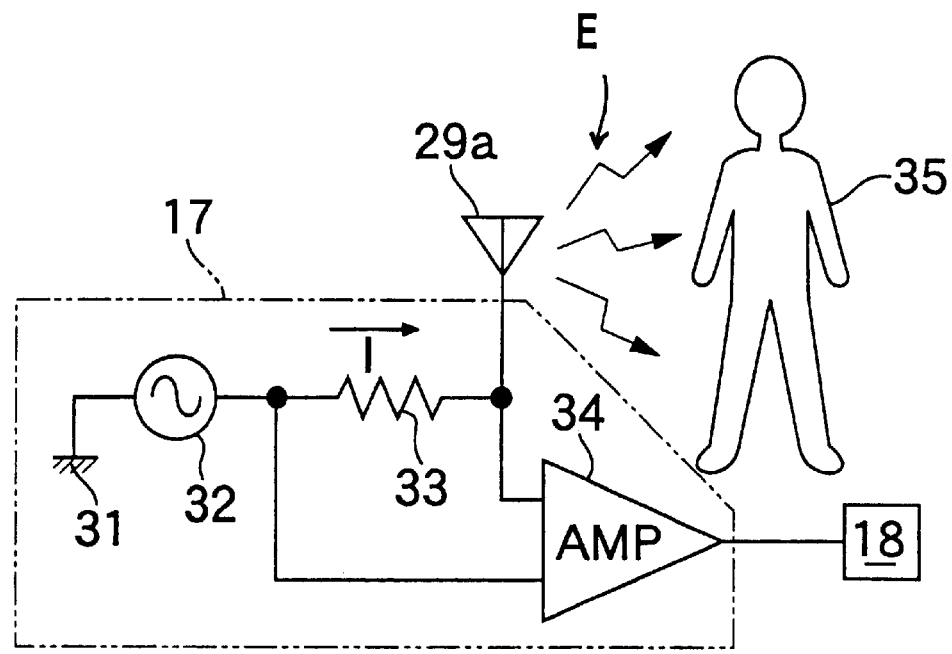
Figure 5:
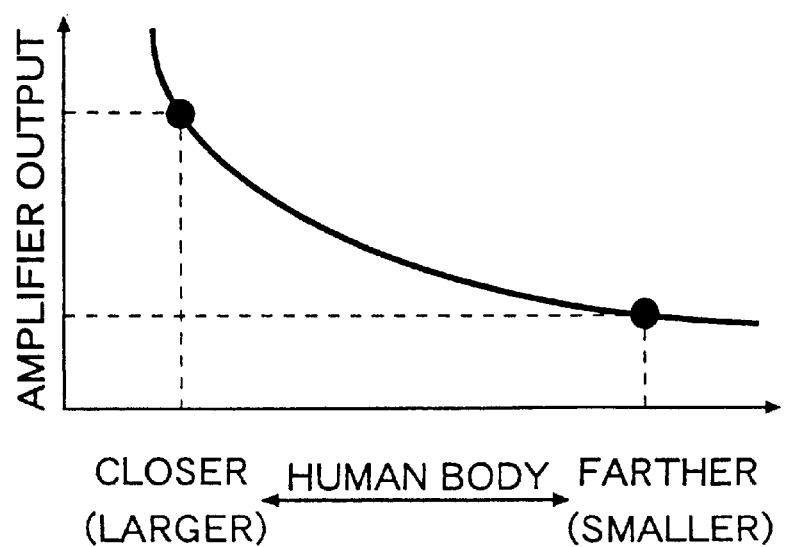

FIG. 4 shows the structure of the electric filed output section 17. The electric field output section 17 includes an electric field generating means 32 comprising a high-frequency generating circuit grounded at its one end to a grounding portion 31. An amplifier 34 and one end of a current monitor resistor 33 for converting the electric current I outputted from the electric field generating means 32 are connected to the other end of the electric field generating means 32. The other end of the current monitor resistor 33 is connected to the amplifier and to the six electrode fabrics 29a, 29b, 29c, 29d, 29e and 29f for activation in sequence at a predetermined time interval.

When no occupant is sitting on the passenger's seat 4 and hence, when the human body, which is a dielectric, is not close to any one of the electrode fabrics 29a, 29b, 29c, 29d, 29e, 29f (e.g.,the electrode fabric 29a) connected to the other end of the current monitor resistor 33, the output current I generated by an electric field E released from the electrode fabric 29a is of an extremely small value depending on a distance between the electrode fabric 29a and the grounding portion 31 and a dielectric constant ($\beta \approx 1$) of air. As are result, the voltage generated at opposite ends of the current monitor resistor 33 and thus, the output from the amplifier 34 are also small. On the other hand, when the human body 35 having a dielectric constant ($\epsilon \approx 80$) larger than that of air sits on the passenger's seat 4, a larger output current I depending on the distance between the electrode fabric 29a and the human body 35 and the area of the human body 35 opposed to the electrode fabric 29a flows across the current monitor resistor 33, and hence, the voltage generated at the opposite ends of the current monitor resistor 33 and thus, the output from the amplifier 34 are also larger.

Therefore, the physique of an occupant sitting on the passenger's seat 4 can be detected by analyzing the pattern of an output from the amplifier 34 corresponding to the six electrode fabrics 29a to 29f.

The occupant detection determining section 18 constitutes a determining means of the present invention, and the current monitor resistor 33 and the amplifier 34 constitute a human body approach detecting means of the present invention in cooperation with each other.

One example of the detection of the physique of an occupant carried out in the occupant detection determining section 18 will be described with reference to FIG. 6.

Figure 6:
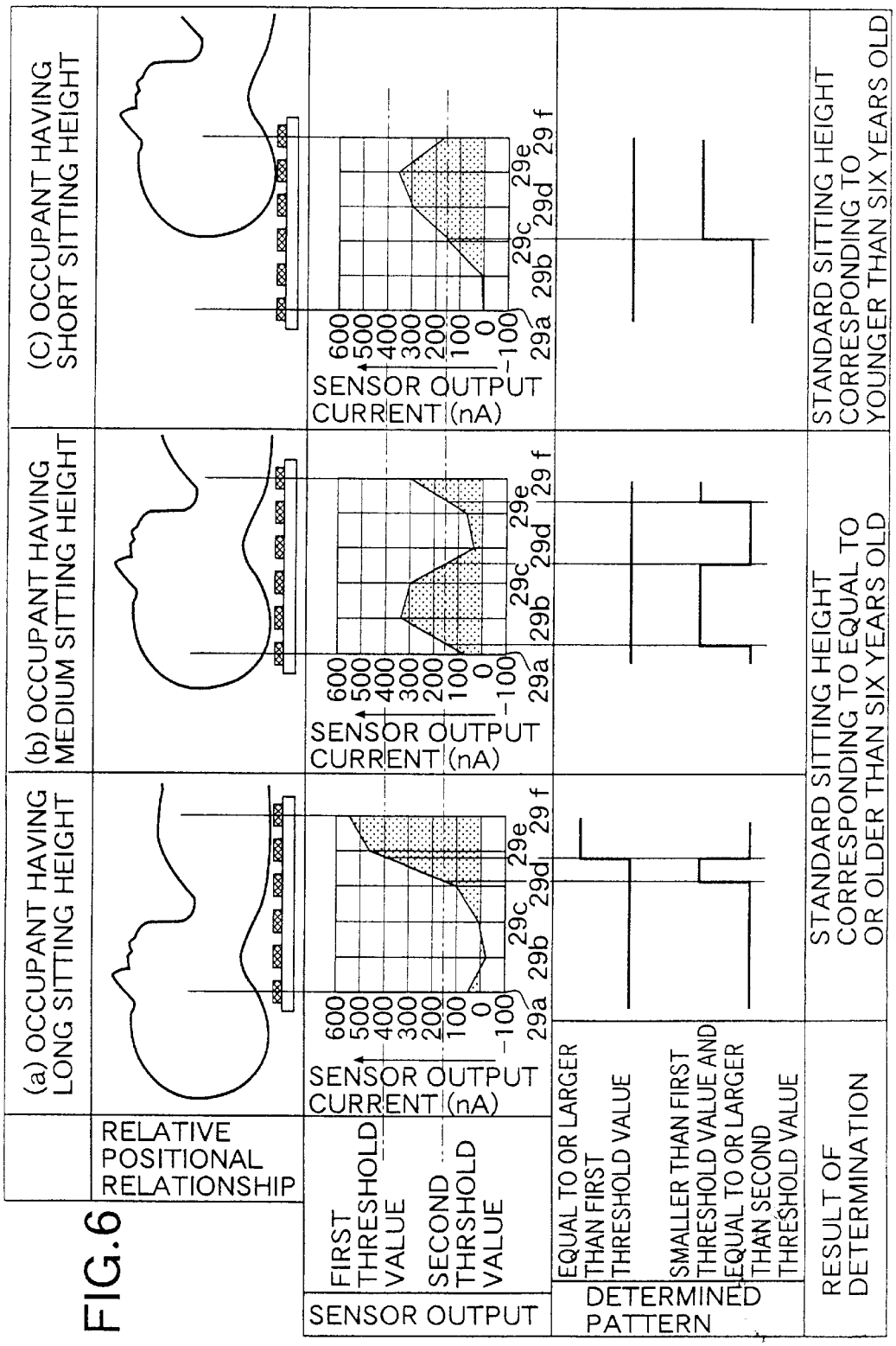

FIG. 6 shows patterns of sensor outputs in correspondence to a case (a) where an occupant having a long sitting height has sat on the passenger's seat 4, a case (b) where an occupant having a medium sitting height has sat on the passenger's seat 4 and a case (c) where an occupant having a short sitting height has sat on the passenger's seat 4. In the case (a), the neck of the occupant is opposed to the electrode fabric 29b which is second from above, and the shoulder of the occupant is opposed to the electrode fabrics 29e and 29f which are fifth and sixth from above, because he has the long sitting height. In the case (b), the head of the occupant is opposed to the electrode fabrics 29a, 29b and 29c which are first, second and third from above, and the neck of the occupant is opposed to the electrode fabrics 29e and 29f which is fourth from above, because he has the medium sitting height. In the case (c), the head of the occupant is opposed to the electrode fabric 29d, 29e and 29f which are fourth, fifth and sixth from above, because he has the short sitting height. The sensor output in FIG. 6 shows a current value (nA) flowing across the current monitor resistor 33, but such value is in a proportional relation to the output from the amplifier 34.

The shoulder is wider in lateral width and abuts against the seat back 27 and hence, the sensor output corresponding to the shoulder is equal to or larger than a first threshold value (e.g., 400 nA) (see FIG. 6a). The neck is narrowest in lateral width and is spaced apart from the seat back 27 and hence, the sensor output corresponding to the neck is substantially 0 (zero) (see FIGS. 6a and 6b). The head is slightly wide in lateral width and abuts against the seat back 27 and hence, the sensor output corresponding to the head is smaller than the first threshold value and equal to, or larger than, a second threshold value (e.g., 150 nA) (see FIG. 6b and 6c).

The case where there is a sensor output equal to, or larger than, the first threshold value as in the case (a) is when the shoulder has been detected, and it is determined that the occupant is one having a long sitting height. The case where there are two sensor outputs smaller than the first threshold value and equal to, or larger than, the second threshold value as in the case (b) is when portions of the head and the shoulder have been detected, and it is determined that the occupant is one having a medium sitting height. The case where there is one sensor output smaller than the first threshold value and equal to, or larger than, the second threshold value as in the case (c) is when the head has been detected, and it is determined that the occupant is one having a short sitting height.

In this way, the physique of the occupant is determined based on the approach of the human body 35 to the electrode fabrics 29d, 29e and 29f embedded in the seat back 27. Therefore, the accurate determination can be carried out without being influenced by a variation in hardness of the seat skin due to a variation in temperature, a variation in sitting attitude of the occupant, a variation in reclining angle of the seat back 27, and the like.

The occupant corresponding to the case (c) is a child of a standard physique younger than six years old. In such case, the occupant detection determining section 18 outputs the air bag deployment prohibiting command signal to the air bag device control unit 19 to prohibit the operation of the air bag device 2, and outputs the warning command signal to light the passenger warning lamp 25 to give a 25 to give a warning to move the child to the rear seat.

Even when it is determined that no occupant is sitting on the passenger's seat 4, the operation of the air bag device 2 is prohibited. Thus, the air bag device 2 for the passenger's seat 4 cannot be wastefully operated upon a collision of the vehicle, whereby the user's economic burden for replacing the wastefully operated air bag device 2 is alleviated.

A second embodiment of the present invention will now be described with reference to FIGS. 7 to 12.

Figure 7:
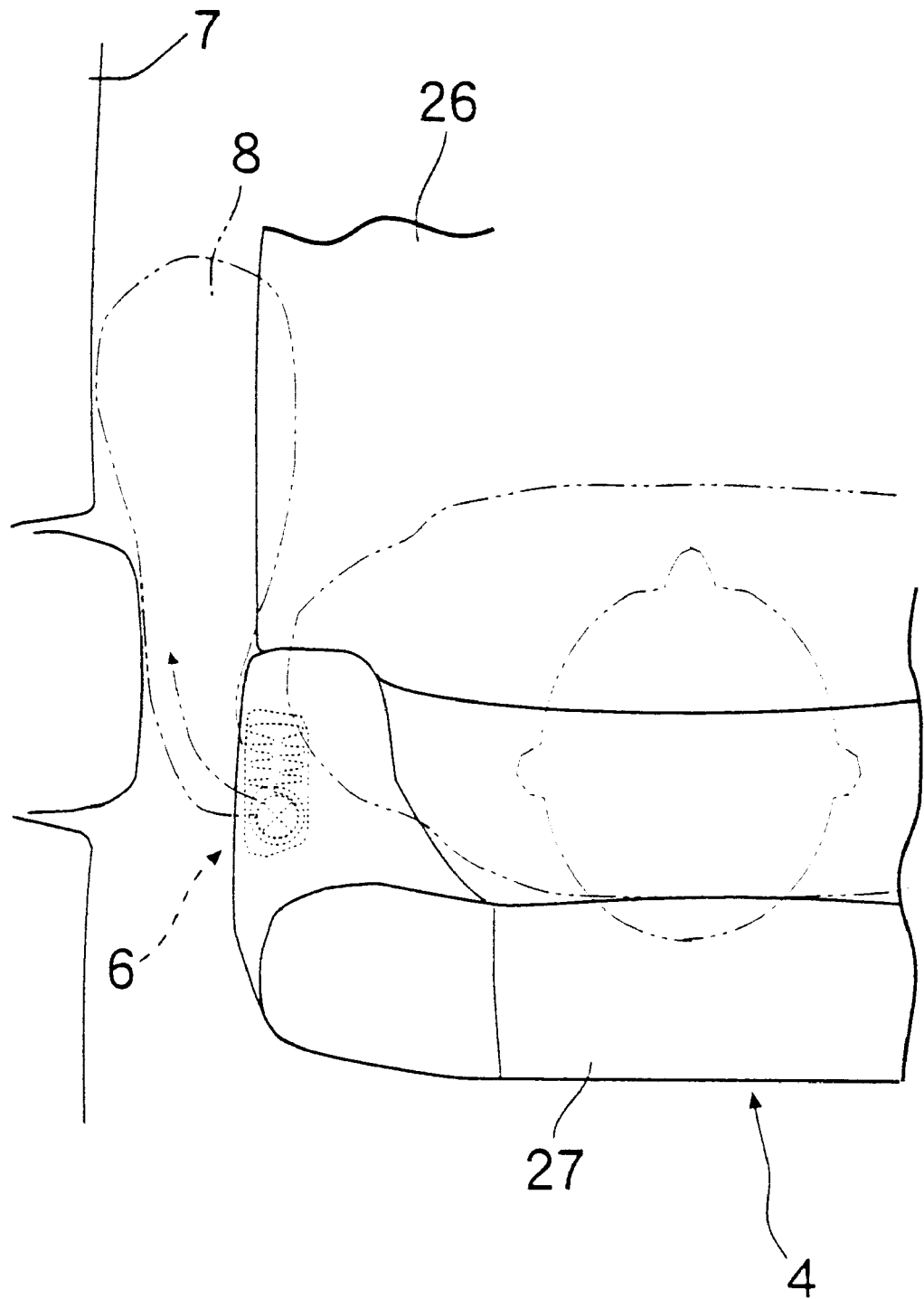

As shown in FIG. 7, in a side air bag device 6 operated upon a side collision of the vehicle and accommodated in that side of seat back 27 of an passenger's seat 4 which is adjacent a door 7, a side air bag 8 is deployed between an occupant sitting on the passenger's seat 4 and an inner surface of the door 7 upon a collision of the vehicle. The side air bag device 6 is designed, so that it is not operated, when the occupant sitting on the passenger's seat 4 is a child having a short sitting height and leaning on the door 7 (see FIG. 12). For this purpose, an occupant detecting unit 5 (see FIG. 1) for detecting a child sitting on the passenger's seat 4 in a state in which he is leaning on the door 7, is mounted in the passenger's seat 4.

Figure 8:
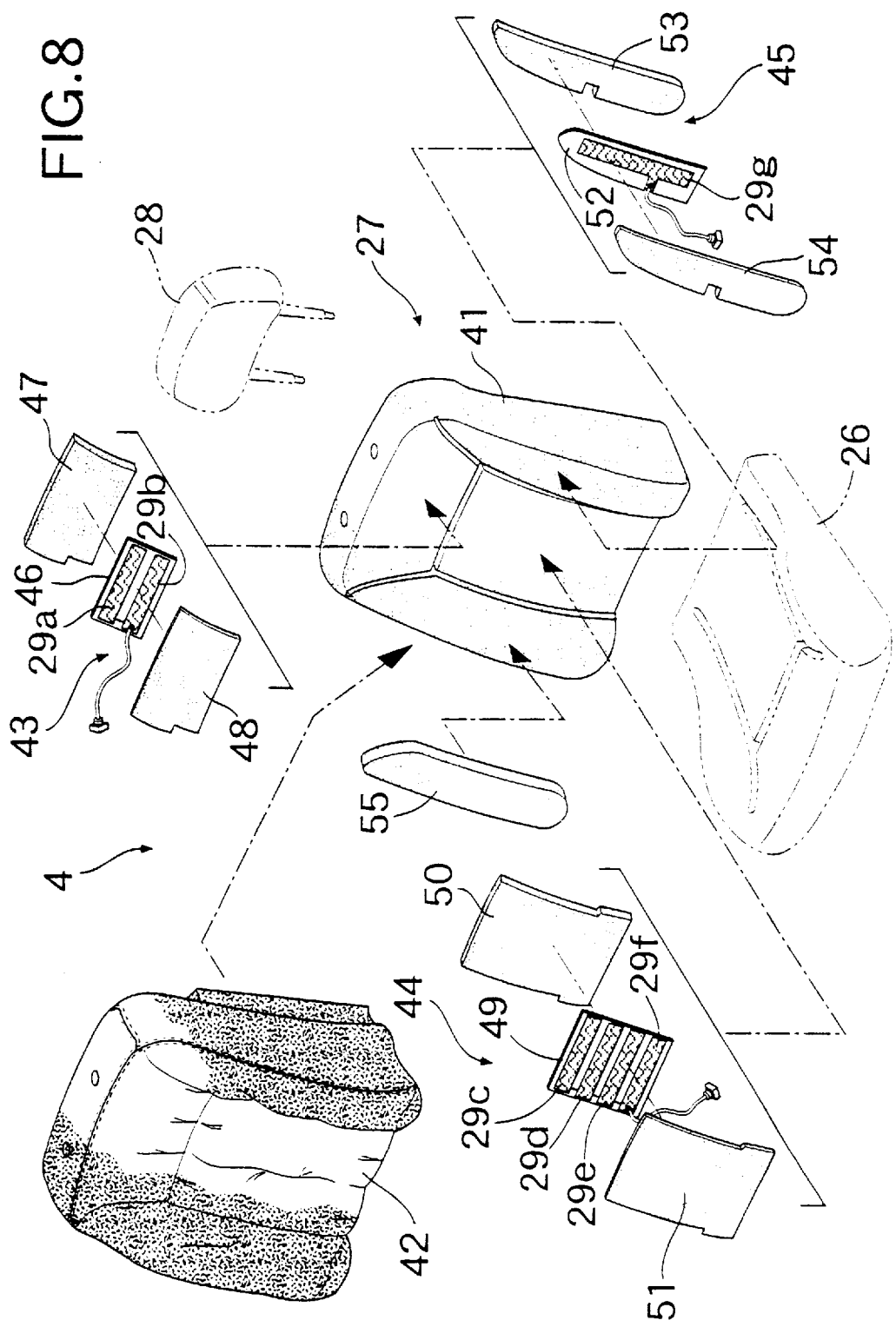
Figure 9:
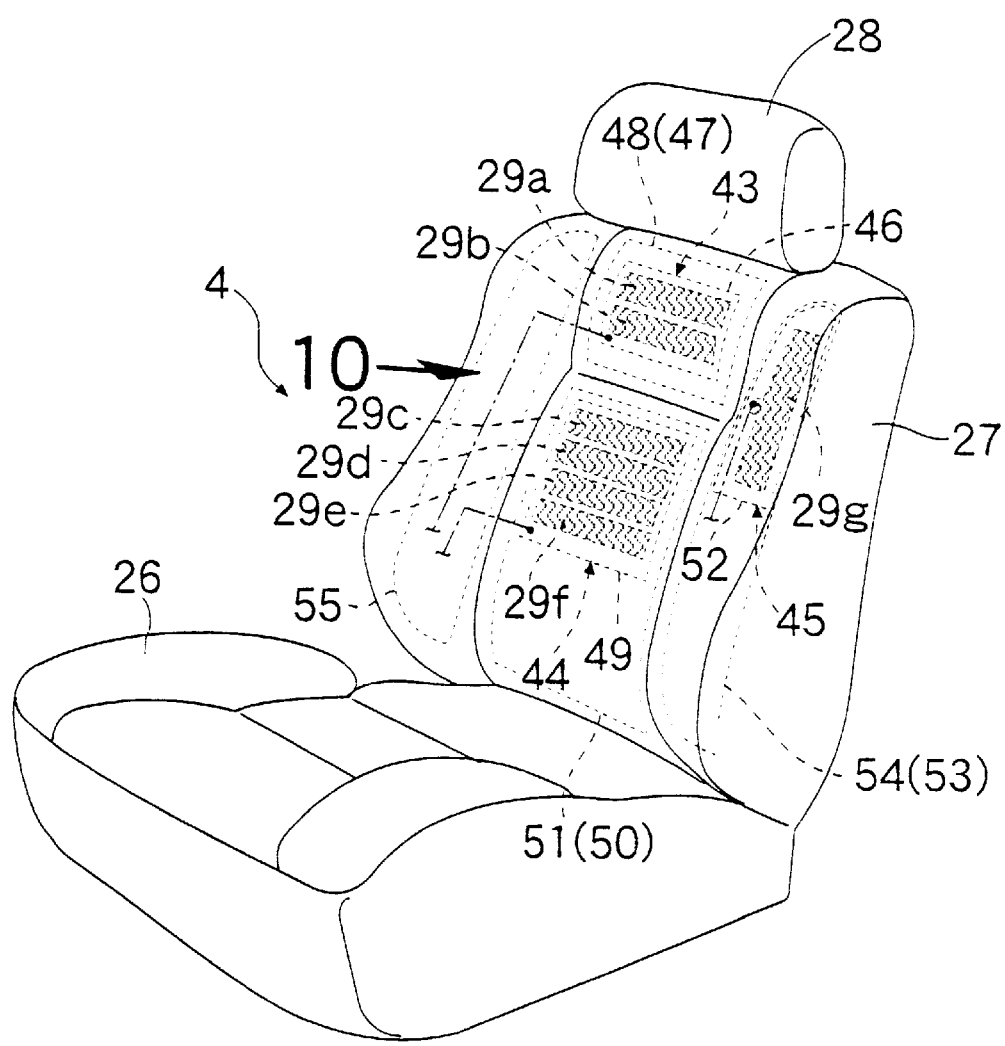

As shown in FIGS. 8 and 9, the passenger's seat 4 is comprised of a seat cushion 26, a seat back 27 and a head rest 28. The seat back 27 includes a pad 41 made of an elastomer, and a trim cover 42 which covers a front surface of the pad 41. Sheet-shaped first, second and third antenna electrodes 43, 44 and 45 constituting a sensor section 16, which will be described hereinafter, are disposed on the front surface of the pad 41 and an inner surface of the trim cover 42 covering a front surface of the seat back 27, against which a back of an occupant sitting on the passenger's seat 4 abuts.

The first antenna electrode 43 is comprised of a non-conductive base fabric 46, and two conductive electrode fabrics 29a and 29b adhered to a surface of the base fabric 46. The first antenna electrode 43 is disposed in a central upper portion of the seat back 27 in a state in which it is sandwiched between two waddings 47 and 48 for improving the driver's comfort. The second antenna electrode 44 is comprised of an non-conductive base fabric 49, and four conductive electrode fabrics 29c, 29d, 29e and 29f adhered to a surface of the base fabric 49, and is disposed in a central portion of the seat back 27 in a state in which it is sandwiched between two waddings 50 and 51. The third antenna electrode 45 is comprised of a non-conductive base fabric 52, and a single conductive electrode fabric 29g adhered to a surface of the base fabric 52, and is disposed in a left side of the seat back 27 in a state in which it is sandwiched between two waddings 53 and 54. A single wadding 55 is disposed in that right side of the seat back 27, which has no antenna electrode mounted therein. The electrode fabrics 29a to 29f of the first and second antenna electrodes 43 and 44 constitute a first electrode fabric of the present invention, and the electrode fabric 29g of the third antenna electrode 45 constitutes a second electrode fabric of the present invention.

Inner ones (on the side of the pad 41) of the waddings 47 and 48; 50 and 51; 53 and 54, which are doubly superposed on each other with the first, second and third antenna electrodes 43, 44 and 45 interposed therebetween, are formed at a larger thickness and previously fixed to an outer surface of the pad 41 by adhering, and outer ones (on the side of the trim cover 42) are formed at a smaller thickness and fixed to an inner surface of the trim cover 42 by adhering. The single wadding 55, which is not in contact with the antenna electrode, is formed at a largest thickness and fixed to the outer surface of the pad 41 by adhering.

Figure 10:
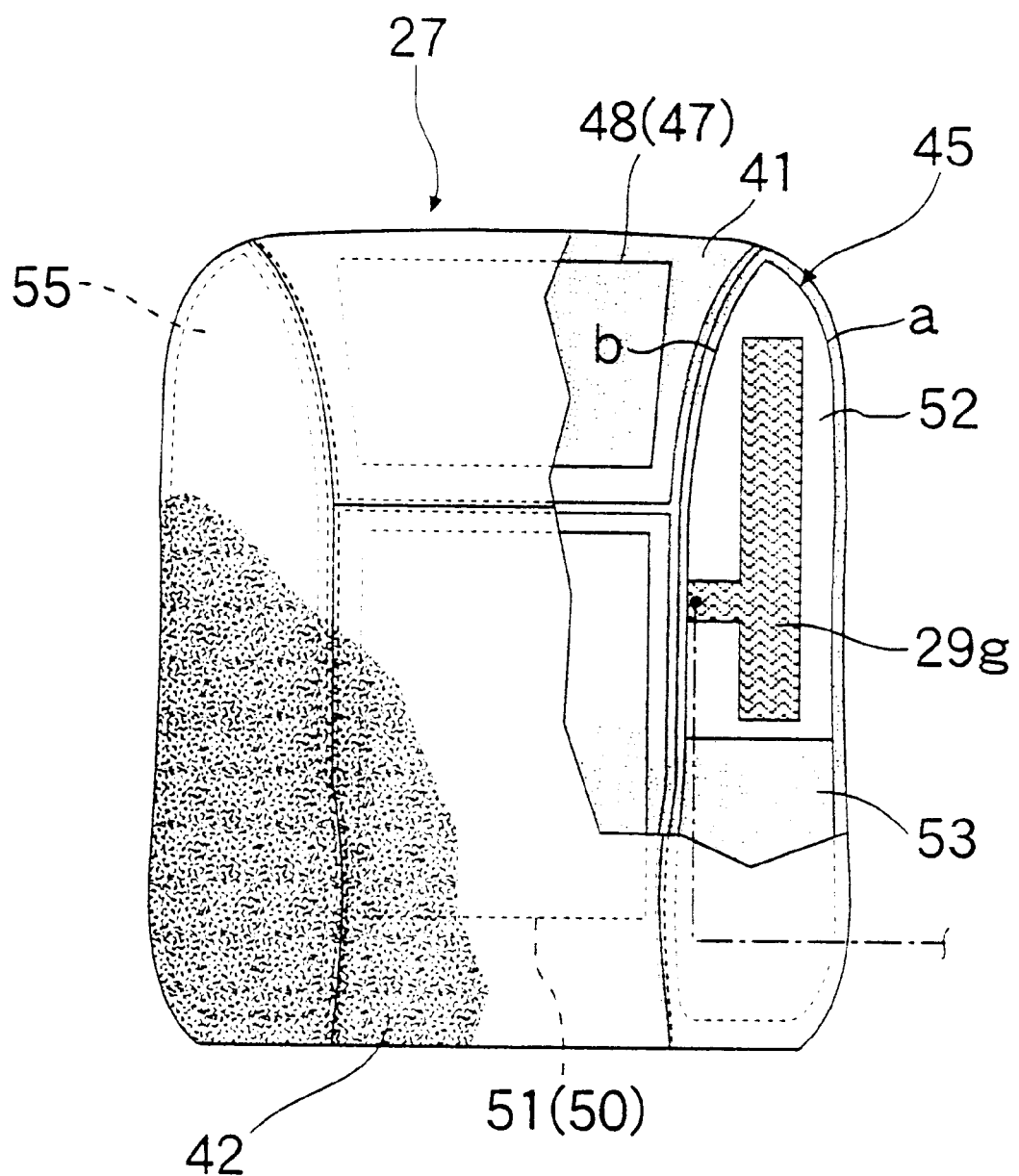

The first, second and third antenna electrodes 43, 44 and 45 are fixed by adhering to the surfaces of the waddings 47, 50 and 53 adhered to the pad 41, respectively. The first and second antenna electrodes 43 and 44 serve to determine whether the occupant is an adult or a child, and the accuracy of the mounted positions of the first and second antenna electrodes 43 and 44 may be relatively low. On the other hand, the third antenna electrode 45 serves to determine whether the occupant is leaning on the door 7, and a relatively high accuracy is required for the mounted position of the third antenna electrode 45. Therefore, the third antenna electrode 45 is easily and precisely positioned at a predetermined location on the pad 41 by conforming the profiles a and b of the third antenna electrode 45 (namely, the profile of and b of the base fabric 52 of the third antenna electrode 45) to the profile of the pad 41, as shown in FIG. 10. Then, the third antenna electrode 45 is fixed to the wadding 53 previously adhered to the pad 41 by adhering.

The positioning of the third antenna electrode 45 is carried out by conforming the profiles a and h of the third antenna electrode 45 to the profile of the pad 41 in the above manner and hence, the third antenna electrode 45 can be positioned without provision of a positioning mark on the pad 41 or the wadding 53 to contribute to a reduction in cost. The first, second and third antenna electrodes 43, 44 and 45 can be positioned as close as possible to the human body by forming the outer waddings 48, 51 and 54 at the smaller thickness to enhance the detection accuracy.

Figure 11:
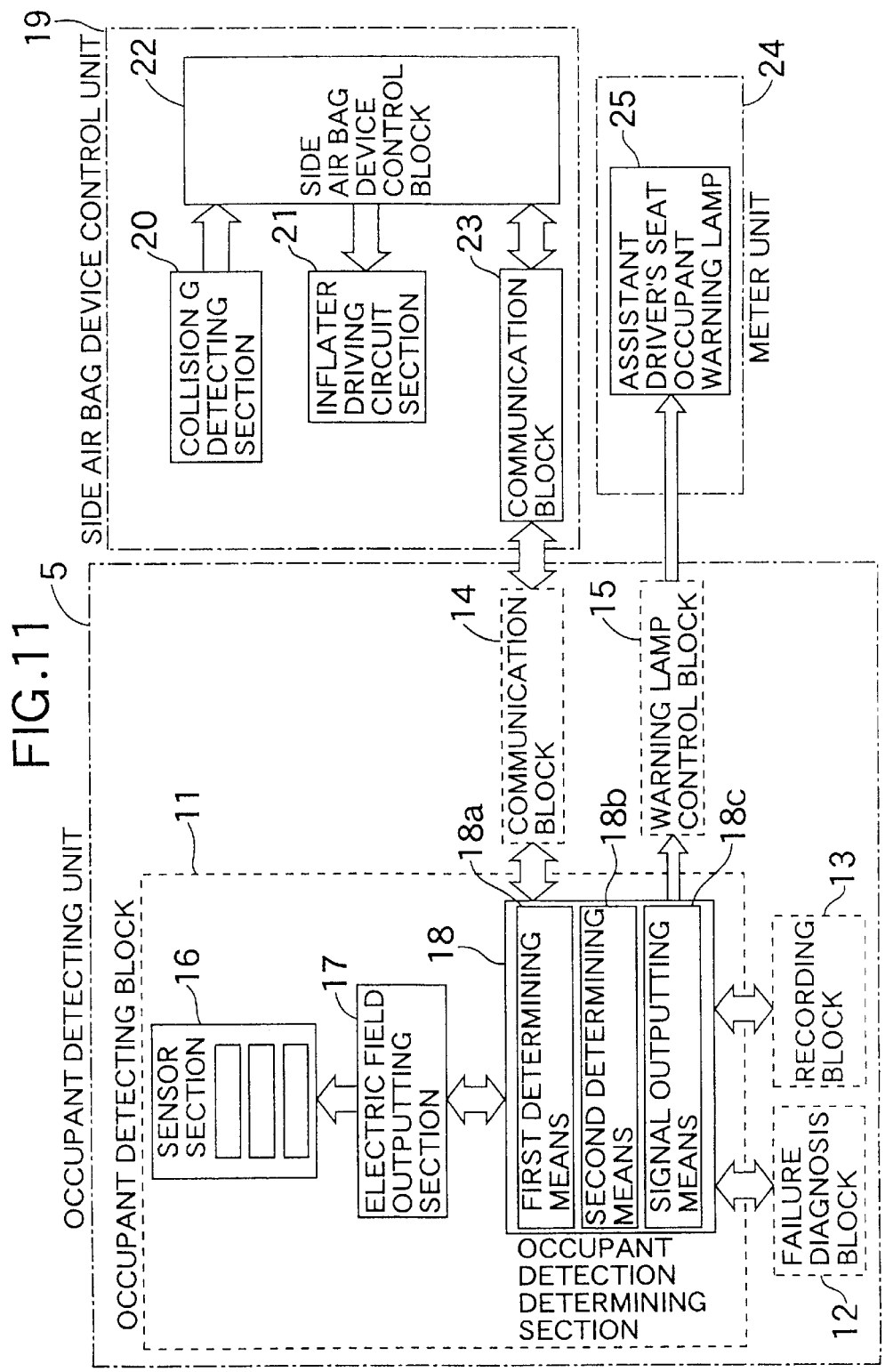
Figure 12:
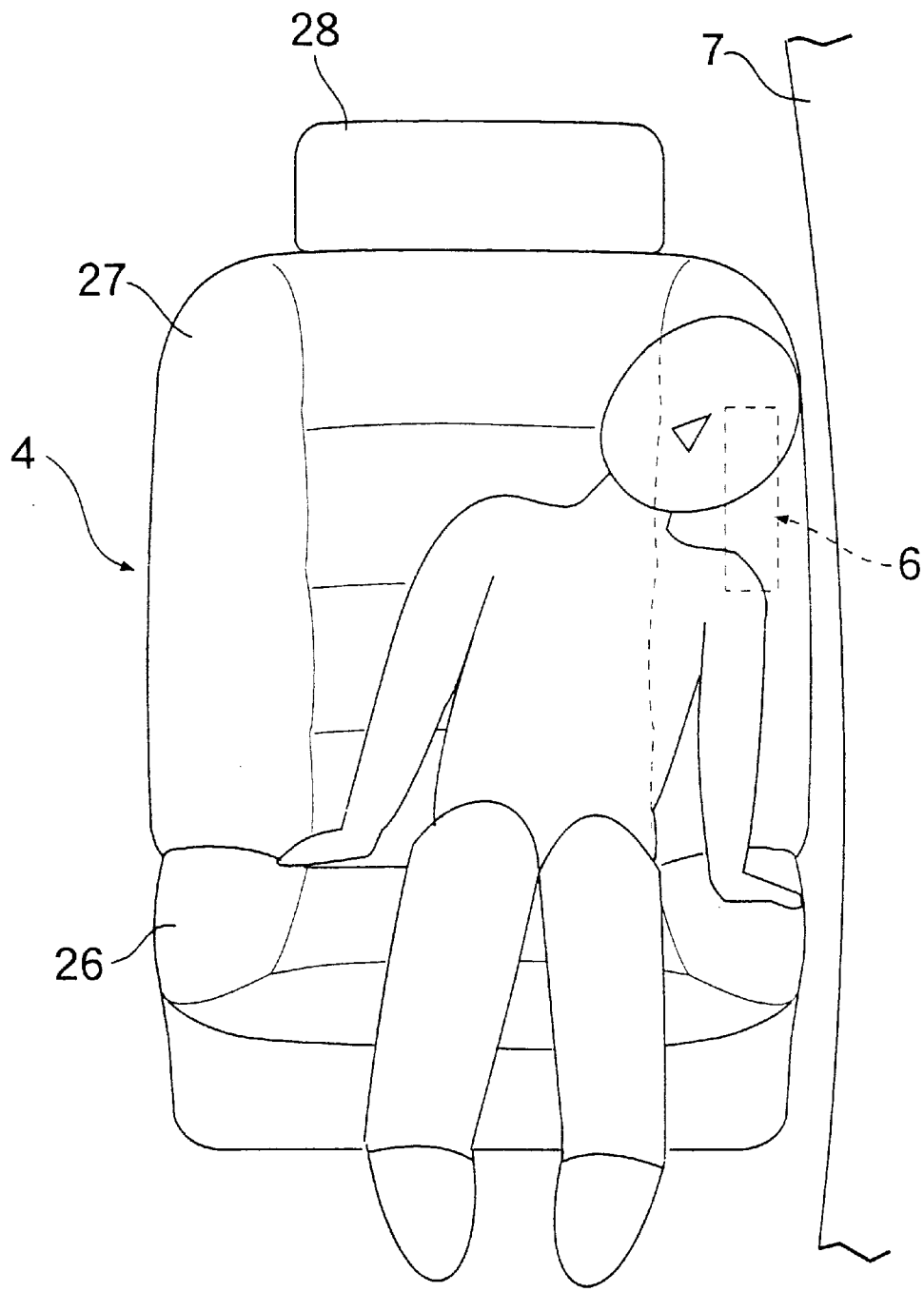
FIG. 12 is an illustration showing a sleeping attitude of a child sitting on the assistant driver's seat.

As shown in FIG. 11, the occupant detecting unit 5 comprises an occupant detecting block 11, a failure diagnosis block 12, a recording block 13, a communication block 14 and a warning lamp control block 15. The occupant detecting block 11 is comprised of a sensor section 16, an electric field output section 17 and an occupant detection determining section 18. Connected to the occupant detection determining section 18 are the failure diagnosis block 12 for detecting an abnormal state, such as a failure and the like, and the recording block 13 for storing various threshold values which are criteria for carrying out the detection of an occupant. The occupant detection determining section 18 is comprised of a first determining means 18a for determining whether an occupant sitting on the passenger's seat 4 is an adult or child, based on the sitting height of the occupant, a second determining means 18b for determining whether an occupant sitting on the passenger's seat 4 is leaning on the door 7, and a signal outputting means 18c for outputting a side air bag deployment prohibiting command signal and a warning command signal based on outputs from the first determining means 18a and the second determining means 18b. The first and second antenna electrodes 43 and 44 are connected to the first determining means 18a, and the third antenna electrode 45 is connected to the second determining means 18b.

A side air bag device control unit 19 is connected to the communication block 14 of the occupant detecting unit 5 and comprised of a collision acceleration detecting section 20, an inflater driving circuit section 21, a side air bag device control block 22, and a communication block 23. When the collision acceleration detecting section 20 detects an acceleration generated due to a collision of the vehicle, the inflater driving circuit section 21 ignites the inflater by a command from the side air bag device control block 22 to operate the side air bag device 6. At this time, when the occupant detection determining section 18 determines that a child is sitting on the passenger's seat 4 and sleeping in a leaning attitude on the door 7, the side air bag deployment prohibiting command signal is outputted to the side air bag device control block 22 via the communication blocks 14 and 23, and the side air bag device control block 22 prohibits the operation of the side air bag device 6 by the inflater driving circuit section 21.

The warning lamp control block 15 of the occupant detecting unit 5 is connected to an passenger's seat occupant warning lamp 25 of a meter unit 24 provided in an instrument panel. When the occupant detection determining section 18 determines that a child is sitting on the passenger's seat 4 and leaning on the door 7 (see FIG. 12), the warning command signal is outputted to light the passenger's seat occupant warning lamp 25 to give a warning to move the child to the rear seat.

Thus, the first determining means 18a of the occupant detection determining section 18 determines whether the occupant sitting on the passenger's seat 4 is an adult having a longer sitting height or a child having a shorter sitting height, by an operation similar to that in the first embodiment.

Further, when the body of an occupant sitting on the passenger's seat 4 approaches the electrode fabric 29g embedded in the side of the seat back 27, the value of electric current flowing across the current monitor resistor 33 is increased. As a result, the second determining means 18b of the occupant detection determining section 18 determines that the occupant sitting on the passenger's seat 4 is in an attitude in which he is leaning on the door 7.

When it is determined by the first determining means 18a that the occupant is a child and it is determined by the second determining means 18b that the occupant is in the attitude in which he is leaning on the door 7 in the above manner, the signal outputting means 18c outputs the side air bag deployment prohibiting command signal to prohibit the operation of the air bag device 6, and also outputs the warning command signal to light the passenger's seat occupant warning lamp 25 to give a warning to move the child to the rear seat. Thus, when the child is sleeping on the passenger's seat 4 in the attitude in which he is leaning on the door 7, the operation of the side air bag device 6 can be prohibited, and thus, it is possible to reliably avoid the interference of the deployed air bag 8 with the child.

Even when it is determined by the first determining means 18a that the occupant is not sitting on the passenger's seat 4, the operation of the side air bag device 6 is prohibited. Thus, the side air bag device 6 for the passenger's seat 4 cannot be wastefully operated upon a collision of the vehicle, whereby the user's economic burden for replacing the wastefully operated air bag device 2 is alleviated.

Figure 13A:
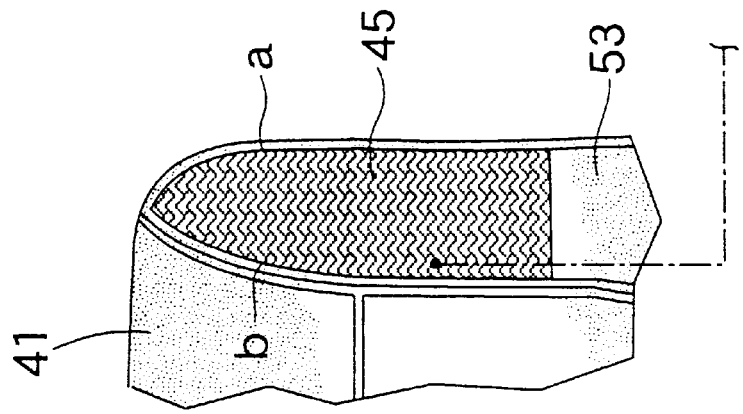
FIGS. 13A to 13C are views showing modifications to the second embodiment.
Figure 13B:
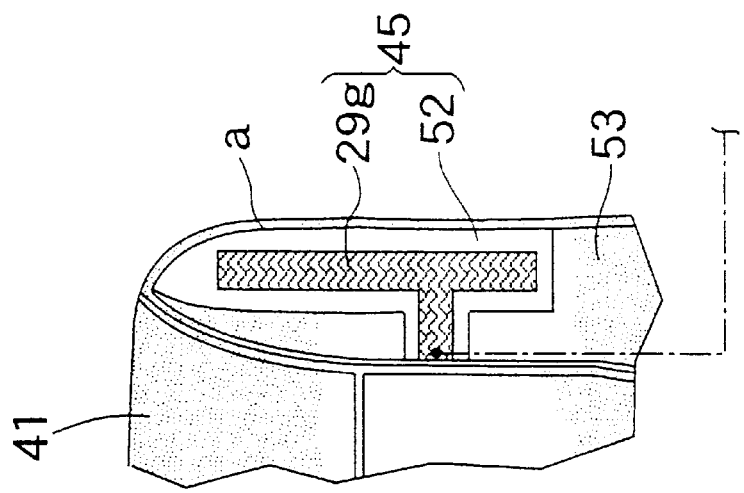
Figure 13C:
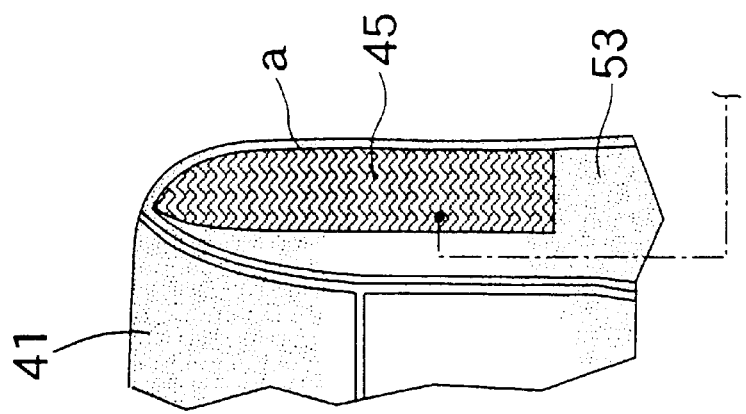

In the second embodiment, the electrode fabric 29g of the third antenna electrode 45 is formed smaller than the base fabric 52, and the profile of the base fabric 52 constitutes the profile a and b of the third antenna electrode 45. However, the base fabric 52 and the electrode fabric 29g can be formed at the same size, as shown in FIG. 13A. Alternatively, the electrode fabric 29g may be formed smaller than the base fabric 52, and only the profile a of the base fabric 52 may be conformed to the profile of the pad 41, as shown in FIG. 13B. Further, the base fabric 52 and the electrode fabric 29g may be formed at the same size, and only the profile a may be conformed to the profile of the pad 41, as shown in FIG. 13C.

Figure 15:
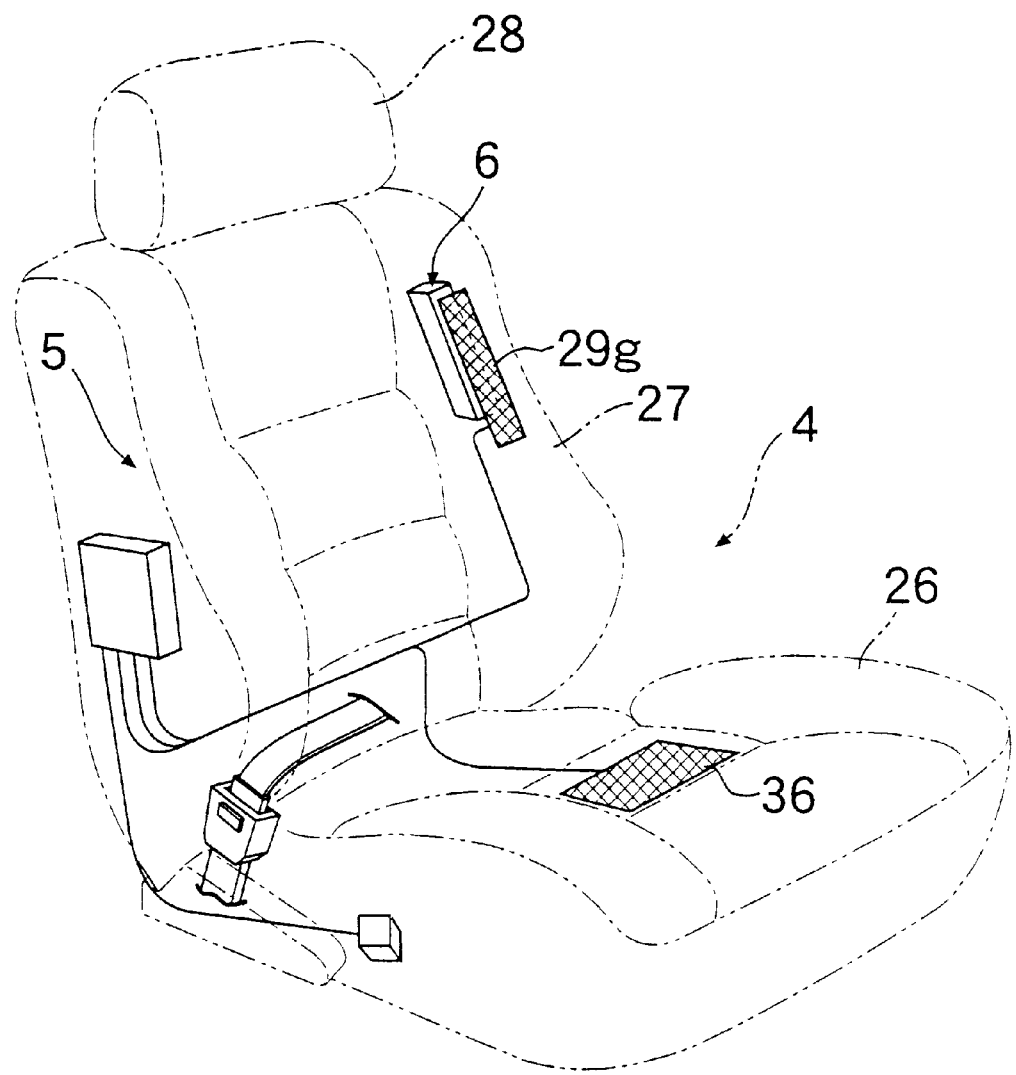

A third embodiment of the present invention will now be described with reference to FIGS. 14 and 15. In the third embodiment, components or portions corresponding to those in the second embodiment are designated by like reference characters.

In the second embodiment, whether the occupant sitting on the passenger's seat 4 is an adult or a child, is detected by detecting the sitting height of the occupant by use of the first and second antenna electrodes 43 and 44. In the third embodiment, however, whether the occupant sitting on the passenger's seat 4 is an adult or a child, is detected by detecting the weight of the occupant by use of a weight detecting means 36 embedded in the seat cushion 26 of the passenger's seat 4.

If the weight of the occupant detected by the weight detecting means 36 is equal to or lower than a standard weight of a child younger than six years old, the first determining means 18a determines that the occupant is a child. As in the second embodiment, if it is determined by the second determining means 18b that the occupant is in an attitude in which he is leaning on the door 7, the signal outputting means 18c outputs the side air bag deployment prohibiting command signal to prohibit the operation of the side air bag device 2, and also outputs the warning command signal to light the passenger's seat occupant warning lamp 25 to give a warning to move the child to the rear seat.

Even in the third embodiment, when a child is sleeping in an attitude in which he is leaning on the door 7, the operation of the side air bag device 6 is prohibited and hence, it is possible to reliably avoid the interference of the deployed side air bag 8 with the child.

Figure 16:
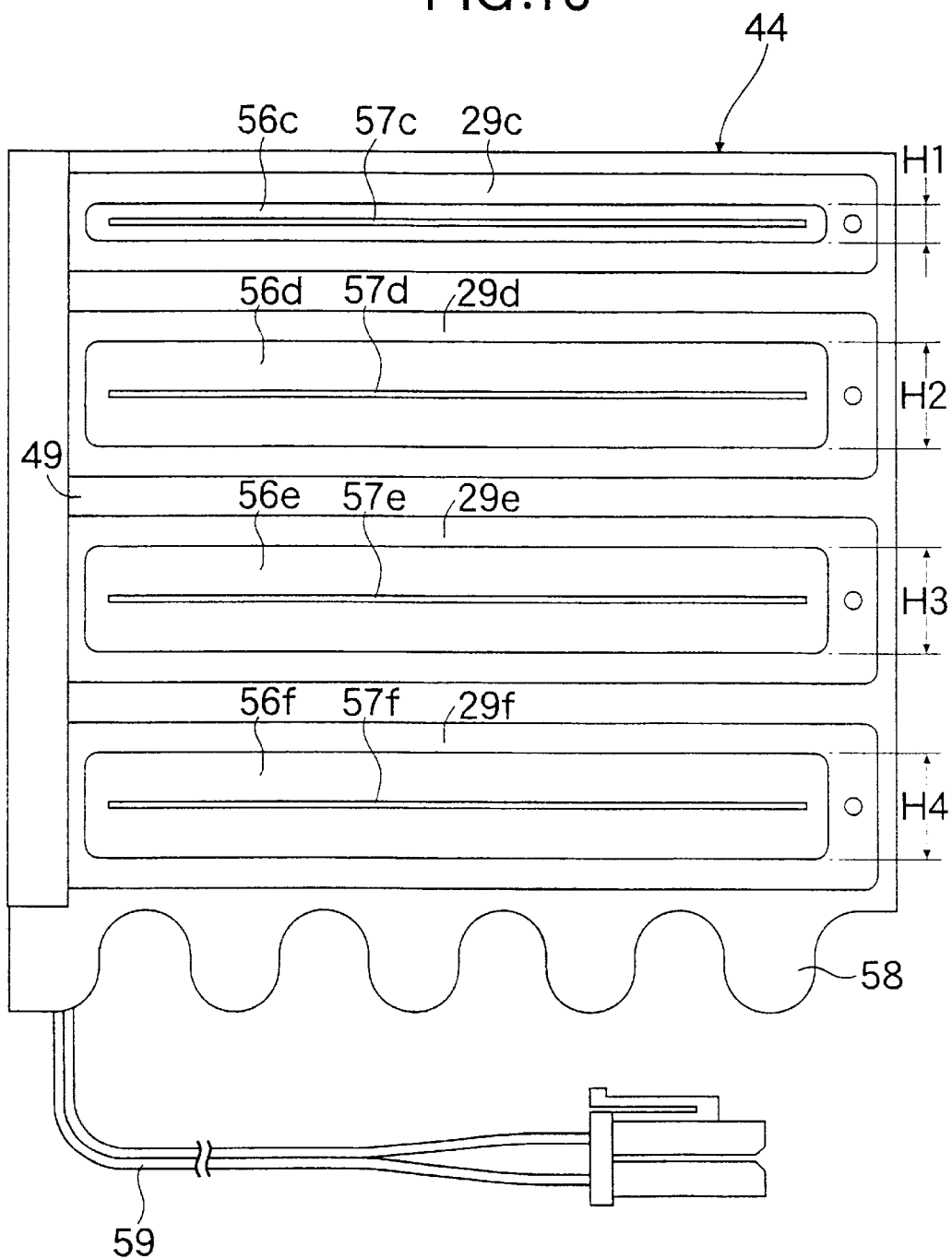
FIG. 16 is an illustration showing an antenna electrode according to a fourth embodiment of the present invention.

A fourth embodiment of the present invention will now be described with reference to FIG. 16.

A second antenna electrode 44 mounted in the lower half of the seat back 28 comprises four electrode fabrics 29c, 29d, 29e and 29f superposed on a base fabric 49. The electrode fabrics 29c, 29d, 29e and 29f are each formed into a loop by longitudinally extending openings 56c, 56d, 56e and 56f, respectively. Slits 57c, 57d, 57e and 57f are defined in the base fabric 49 facing the four openings 56c, 56d, 56e and 56f, and extend along the centers of the openings 56c, 56d, 56e and 56f, respectively. The flexibility of the second antenna electrode 44 is increased by virtue of the openings 56c, 56d, 56e and 56f and the slits 57c, 57d, 57e and 56f. Therefore, it is possible to avoid the injuring of the sitting feeling of the occupant sitting on the seat 4 by virtue of the second antenna electrode 44 to improve the comfort of sitting on the seat 4.

The width H1 of the opening 56c in the electrode fabric 29c located in the upper portion of the seat back 28 is set smaller than the widths H2, H3 and H4 of the openings 56d, 56e and 56f in the three electrode fabrics 28d, 29e and 29f located in the lower portion of the seat back 28, thereby providing an enhancement in sensitivity of detection of an occupant. Specifically, when the occupant is a child having a short sitting height, the sensitivity can be enhanced by ensuring a sufficient area of contact between the occupant and the electrode fabric 29c located at the upper portion of the seat back 28. Further, the base fabric 49 cane accustomed to the curved shape of the lower portion of the seat back 28 by forming the lower edge of the base fabric 49 as an undulated portion 58. The four electrode fabrics 29c, 29d, 29e and 29f are connected to a harness 59 at a side of the second antenna electrode 44.

The injuring of the sitting feeling can be avoided by forming the first and third antenna electrodes 43 and 45 in the same configuration as the second antenna electrode 44. More specifically, in the first antenna electrode 43, openings are made in the two electrode fabrics 29a and 29b, and slits are defined in the base fabric 46 (see FIG. 8) facing the openings. In the second antenna electrode 45, an opening is made in the one electrode fabric 29g, and a slit is defined in the base fabric 52 (see FIG. 8) facing the opening, thereby improving the sitting comfort of the seat 4.

Figure 17:
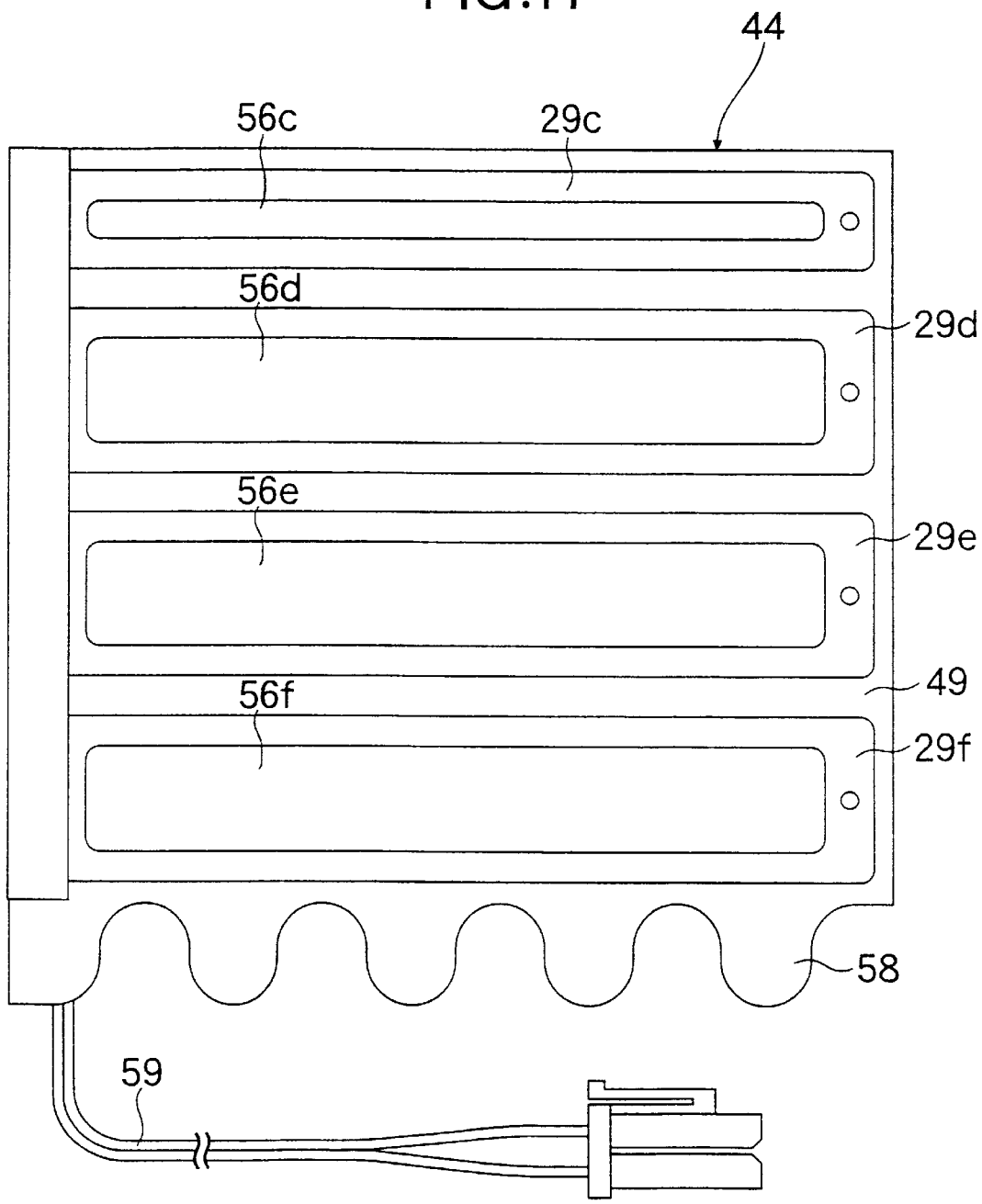
FIG. 17 is an illustration showing a modification to the fourth embodiment of the present invention.

FIG. 17 shows a modification to the fourth embodiment. Openings 56c, 56d, 56e and 56f are only defined in the electrode fabrics 29c, 29d, 29e and 29f, and slits 57c, 57d, 57e and 57f (see FIG. 16) are not defined in the base fabric 49.

FIG. 18 shows another modification to the fourth embodiment. Openings 56c, 56d, 56e and 56f are made in the electrode fabrics 29c, 29d, 29e and 29f in the same shapes as the slits 57c, 57d, 57e and 57f in the base fabric 49.

Although the embodiments of the present invention have been described in detail, it will be understood that the present invention is not limited to the above-described embodiments, and various modifications in design may be made without departing from the spirit and scope of the invention defined in claims.

For example, in each of the embodiments, the output current proportional to the voltage at the opposite ends of the current monitor resistor 33 provided between the electric field generating means 32 and the electrode fabrics 29a, 29b, 29c, 29d, 29e, 29f and 29g is used as a sensor output. Alternatively, the output power may be used as the sensor output in place of the output current. Yet alternatively, a control quantity provided by controlling the output current or output power so that it becomes a predetermined value, may be used as a sensor output. Further, electric current or power may be detected in place of detection of the electric current or power flowing between the electric field generating means 32 and the electrode fabrics 29a, 29b, 29c, 29d, 29e, 29f and 29g.

Each of the embodiments has been described as for the front passenger's seat 4, but the present invention is applicable to the rear seat, and the subject occupant is not limited to the child and may be a small-sized adult.

The arrangement having an antenna electrode conformed in profile at least partly to that of a pad has been applied to only the third antenna electrode 45 of the first, second and third antenna electrodes 43, 44 and 45 in the second embodiment, but as required, the this arrangement may be also applied to the first and second antenna electrodes 43 and 44.

When the physique of an occupant is detected by the first antenna electrodes 29a, 29b, 29c, 29d, 29e and 29f embedded in the central portion of the seat back 27, if a child is sleeping in an attitude in which he or she is leaning against the door 1, there may be a case where the back of the child is separated from the seat back 27 and the physique of the child cannot be detected by the first antenna electrodes 29a, 29b, 29c, 29d, 29e and 29f. Even in such a case, however, if it is arranged that the operation of the side air bag device 2 is prohibited during the occupant being detected by the second antenna electrode 29g which is embedded in the side portion of the seat back 27, it is then possible to reliably avoid the interference of a deployed side air bag 3 with the child.

When an occupant wears bulky clothes, the distance between the body of the occupant and the first antenna electrodes 29a, 29b, 29c, 29d, 29e and 29f embedded in the central portion of the seat back 27 increases due to the bulky clothes, and hence there is a possibility that the physique of the occupant cannot be detected by the first antenna electrodes 29a, 29b, 29c, 29d, 29e and 29f. Even in such a case, the second antenna electrode 29g embedded in the side portion of the seat back 27 detects the upper arm of the occupant, covered with a relatively thin portion of the clothes, and the second antenna electrode 29g can detect the presence of the occupant sitting on the assistant driver's seat 4. Accordingly, it is possible to reliably control to permit an operation of the side air bag device 2 only when the occupant is sitting on the assistant driver's seat 4, in order to contribute to the reduction in the user's economic burden by prohibiting a wasteful operation of the side air bag device 2.

What is claimed is:

1. An occupant detecting system comprising an electric fabric embedded in a side of a seat back of a seat in an automobile, an electric field generating means for generating an electric field around said electrode fabric, a human body approach detecting means for detecting the approach of a human body to said electrode fabric based on electric current flowing from said electric field generating means to said electrode fabric, and a determining means for determining whether the body of an occupant sitting on the seat is leaning sideways, based on an output from said human body approach detecting means.

2. An occupant detecting system comprising a plurality of first electrode fabrics embedded in a central portion of a seat back of a seat in an automobile, at least one second electrode fabric embedded in a side of the seat back of the seat, an electric field generating means for generating an electric field around said first and second electrode fabrics, a human body approach detecting means for detecting the approach of a human body to said first and second electrode fabrics, based on electric current flowing from said electric field generating means to said first and second electrode fabrics, a first determining means for determining whether a sitting height of an occupant sitting on the seat is equal to or smaller than a reference value by comparing a combined pattern of outputs from said human body approach detecting means which correspond to said first electrode fabrics with a previously stored pattern, a second determining means for determining whether the body of an occupant sitting on the seat is leaning sideways, based on an output from said human body approach detecting means which corresponds to said second electrode fabric, and a signal outputting means for outputting a signal indicative of a command to prohibit the deployment of a side air bag device provided in the side of the seat back, when said first determining means determines that the sitting height of the occupant sitting on the seat is equal to or smaller than the reference value, and said second determining means determines that the body of said occupant is leaning sideways.

3. An occupant detecting system according to claim 2, wherein each of said electrode fabrics is formed into a laterally elongated band shape, and said electrode fabrics are disposed at a plurality of vertically arranged stages.

4. An occupant detecting system according to claim 2, wherein said signal outputting means outputs a warning command signal, when said first determining means determines that the sitting height of the occupant sitting on the seat is equal to or smaller than the reference value and said second determining means determines that the body of said occupant is leaning sideways.

5. An occupant detecting system comprising a weight detecting means embedded in a seat cushion of a seat in an automobile, at least one electrode fabric embedded in a side of a seat back of the seat, an electric field generating means for generating an electric field around said electrode fabric, a human body approach detecting means for detecting the approach of a human body to said electrode fabric, based on electric current flowing from said electric field generating means to said electrode fabric, a first determining means for determining whether the weight of an occupant sitting on the seat is equal to or smaller than a reference value, based on an output from said weight detecting means, a second determining means for determining whether the body of the occupant sitting on the seat is leaning sideways, based on an output from said human body approach detecting means, and a signal outputting means for outputting a signal indicative of a command to prohibit the deployment of a side air bag device provided in the side of the seat back, when the first determining means determines that the weight of the occupant sitting on the seat is equal to or smaller than the reference value and the second determining means-determines that the body of said occupant is leaning sideways.

6. An occupant detecting system according to claim 5, wherein said signal outputting means outputs a warning command signal, when said first determining means determines that the weight of the occupant sitting on the seat is equal to or smaller than the reference value and said second determining means determines that the body of said occupant is leaning sideways.

7. An occupant detecting system comprising an electrode member embedded in a side of a seat back of a seat in an automobile, an electric field generating means for generating an electric field around said electrode member, a human body approach detecting means for detecting the approach of a human body to said electrode member based on electric current flowing from said electric field generating means to said electrode member, and a determining means for determining whether the body of an occupant sitting on the seat is leaning sideways, based on an output from said human body approach detecting means.

8. An occupant detecting system comprising a plurality of first electrode members embedded in a central portion of a seat back of a seat in an automobile, at least one second electrode member embedded in a side of the seat back of the seat, an electric field generating means for generating an electric field around said first and second electrode members, a human body approach detecting means for detecting the approach of a human body to said first and second electrode members, based on electric current flowing from said electric field generating means to said first and second electrode members, a first determining means for determining whether a sitting height of an occupant sitting on the seat is equal to, or smaller than, a reference value by comparing a combined pattern of outputs from said human body approach detecting means which correspond to said first electrode members with a previously stored pattern, a second determining means for determining whether the body of an occupant sitting on the seat is leaning sideways, based on an output from said human body approach detecting means which corresponds to said second electrode member, and a signal outputting means for outputting a signal indicative of a command to prohibit the deployment of a side air bag device provided in the side of the seat back when said first determining means determines that the sitting height of the occupant sitting on the seat is equal to, or smaller than, the reference value, and said second determining means determines that the body of said occupant is leaning sideways.

9. An occupant detecting system according to claim 8, wherein each of said electrode members is formed into a laterally elongated band shape, and said electrode members are disposed at a plurality of vertically arranged stages.

10. An occupant detecting system according to claim 8, wherein said signal outputting means outputs a warning command signal when said first determining means determines that the sitting height of the occupant sitting on the seat is equal to, or smaller than, the reference value and said second determining means determines that the body of said occupant is leaning sideways.

11. An occupant detecting system comprising a weight detecting means embedded in a seat cushion of a seat in an automobile, at least one electrode member embedded in a side of a seat back of the seat, an electric field generating means for generating an electric field around said electrode member, a human body approach detecting means for detecting the approach of a human body to said electrode member, based on electric current flowing from said electric field generating means to said electrode member, a first determining means for determining whether the weight of an occupant sitting on the seat is equal to, or smaller than, a reference value, based on an output from said weight detecting means, a second determining means for determining whether the body of the occupant sitting on the seat is leaning sideways, based on an output from said human body approach detecting means, and a signal outputting means for outputting a signal indicative of a command to prohibit the deployment of a side air bag device provided in the side of the seat back when the first determining means determines that the weight of the occupant sitting on the seat is equal to or smaller than the reference value and the second determining means determines that the body of said occupant is leaning sideways.

12. An occupant detecting system according to claim 11, wherein said signal outputting means outputs a warning command signal when said first determining means determines that the weight of the occupant sitting on the seat is equal to, or smaller than, the reference value and said second determining means determines that the body of said occupant is leaning sideways.

* * * * *